(12) United States Patent
Yu et al.

(10) Patent No.: US 8,507,840 B2
(45) Date of Patent: Aug. 13, 2013

(54) VERTICALLY STRUCTURED PASSIVE PIXEL ARRAYS AND METHODS FOR FABRICATING THE SAME

(75) Inventors: Young-June Yu, Cranbury, NJ (US); Peter Duane, Waltham, MA (US); Munib Wober, Topsfield, MA (US)

(73) Assignee: Zena Technologies, Inc., Cambridge, MA (US)

( * ) Notice: Subject to any disclaimer, the term of this patent is extended or adjusted under 35 U.S.C. 154(b) by 321 days.

(21) Appl. No.: 12/974,499

(22) Filed: Dec. 21, 2010

(65) Prior Publication Data

US 2012/0153124 A1   Jun. 21, 2012

(51) Int. Cl.
*H01L 31/00*   (2006.01)
*H01J 40/14*   (2006.01)

(52) U.S. Cl.
USPC .................................. 250/214.1; 250/214 R

(58) Field of Classification Search
USPC ............... 250/208.1, 214.1, 214 R, 239, 216; 977/762, 855–859, 953; 438/73, 478; 257/291, 257/292, 327–332
See application file for complete search history.

(56) References Cited

U.S. PATENT DOCUMENTS

| | | | |
|---|---|---|---|
| 1,918,848 A | 4/1929 | Land | |
| 3,903,427 A | 9/1975 | Pack | |
| 4,017,332 A | 4/1977 | James | |
| 4,387,265 A | 6/1983 | Dalal | |
| 4,400,221 A | 8/1983 | Rahilly | |
| 4,443,890 A | 4/1984 | Eumurian | |
| 4,513,168 A | 4/1985 | Borden | |
| 4,827,335 A | 5/1989 | Saito | |
| 4,880,613 A | 11/1989 | Satoh | |
| 4,896,941 A | 1/1990 | Hayashi | |
| 4,950,625 A | 8/1990 | Nakashima | |
| 4,971,928 A | 11/1990 | Fuller | |
| 4,972,244 A | 11/1990 | Buffet | |
| 5,096,520 A | 3/1992 | Faris | |

(Continued)

FOREIGN PATENT DOCUMENTS

| | | |
|---|---|---|
| JP | 2002151715 | 5/2002 |
| JP | 2005252210 | 9/2005 |

(Continued)

OTHER PUBLICATIONS

Deptuch et al., Vertically Integrated Circuits at Fermilab, IEEE Transactions on Nuclear Science, Aug. 2010, vol. 54, Issue 4, pp. 2178-2186.

(Continued)

*Primary Examiner* — Que T Le
*Assistant Examiner* — Don Williams
(74) *Attorney, Agent, or Firm* — Pillsbury Winthrop Shaw Pittman LLP

(57) ABSTRACT

An image sensor and methods of use the image sensor, methods of manufacturing the image sensor, and apparatuses comprising the image sensor are disclosed. The image sensor has pixels includes at least one nanopillar with a gate electrode surrounding the at least one nanopillar, wherein the at least one nanopillar is adapted to convert light impinging thereon to electrical signals and the gate electrode is operable to pinch off or allow current flow through the at least one nanopillar. The image sensor can have a plurality of pixels arranged in an individually addressable fashion. The at least one nanopillar has a cladding. A refractive index of the cladding being smaller than a refractive index of the nanopillar.

30 Claims, 17 Drawing Sheets

(56) References Cited

U.S. PATENT DOCUMENTS

| | | | |
|---|---|---|---|
| 5,124,543 A | 6/1992 | Kawashima | |
| 5,272,518 A | 12/1993 | Vincent | |
| 5,311,047 A | 5/1994 | Chang | |
| 5,347,147 A | 9/1994 | Jones | |
| 5,362,972 A | 11/1994 | Yazawa | |
| 5,401,968 A | 3/1995 | Cox | |
| 5,449,626 A | 9/1995 | Hezel | |
| 5,468,652 A | 11/1995 | Gee | |
| 5,602,661 A | 2/1997 | Schadt | |
| 5,612,780 A | 3/1997 | Rickenbach | |
| 5,723,945 A | 3/1998 | Schermerhorn | |
| 5,747,796 A | 5/1998 | Heard | |
| 5,767,507 A | 6/1998 | Unul | |
| 5,798,535 A | 8/1998 | Huang | |
| 5,853,446 A | 12/1998 | Carre | |
| 5,877,492 A | 3/1999 | Fujieda | |
| 5,880,495 A | 3/1999 | Chen | |
| 5,900,623 A | 5/1999 | Tsang et al. | |
| 5,943,463 A | 8/1999 | Unuma | |
| 6,033,582 A | 3/2000 | Lee | |
| 6,037,243 A | 3/2000 | Ha et al. | |
| 6,046,466 A | 4/2000 | Ishida et al. | |
| 6,074,892 A | 6/2000 | Bowers et al. | |
| 6,100,551 A | 8/2000 | Lee | |
| 6,270,548 B1 | 8/2001 | Campbell | |
| 6,326,649 B1 | 12/2001 | Chang | |
| 6,388,243 B1 | 5/2002 | Berezin | |
| 6,388,648 B1 | 5/2002 | Clifton | |
| 6,459,034 B2 | 10/2002 | Muramoto et al. | |
| 6,542,231 B1 | 4/2003 | Garrett | |
| 6,566,723 B1 | 5/2003 | Vook | |
| 6,680,216 B2 | 1/2004 | Kwasnick et al. | |
| 6,709,929 B2 | 3/2004 | Zhang et al. | |
| 6,720,594 B2 | 4/2004 | Rahn | |
| 6,771,314 B1 | 8/2004 | Bawolek | |
| 6,805,139 B1 | 10/2004 | Savas | |
| 6,812,473 B1 | 11/2004 | Amemiya | |
| 6,927,145 B1 | 8/2005 | Yang | |
| 6,960,526 B1 | 11/2005 | Shah | |
| 6,967,120 B2 | 11/2005 | Jang | |
| 6,969,899 B2 | 11/2005 | Yaung | |
| 6,987,258 B2 | 1/2006 | Mates | |
| 6,996,147 B2 | 2/2006 | Majumdar | |
| 7,052,927 B1 | 5/2006 | Fletcher | |
| 7,105,428 B2 | 9/2006 | Pan | |
| 7,109,517 B2 | 9/2006 | Zaidi | |
| 7,153,720 B2 | 12/2006 | Augusto | |
| 7,163,659 B2 | 1/2007 | Stasiak | |
| 7,230,286 B2 | 6/2007 | Cohen et al. | |
| 7,235,475 B2 | 6/2007 | Kamins | |
| 7,241,434 B2 | 7/2007 | Anthony | |
| 7,254,151 B2 | 8/2007 | Lieber | |
| 7,262,400 B2 | 8/2007 | Yaung | |
| 7,265,328 B2 | 9/2007 | Mouli | |
| 7,285,812 B2 | 10/2007 | Tang et al. | |
| 7,306,963 B2 | 12/2007 | Linden | |
| 7,307,327 B2 | 12/2007 | Bahl | |
| 7,311,889 B2 | 12/2007 | Awano | |
| 7,330,404 B2 | 2/2008 | Peng | |
| 7,335,962 B2 | 2/2008 | Mouli | |
| 7,336,860 B2 | 2/2008 | Cyr | |
| 7,358,583 B2 | 4/2008 | Reznik | |
| 7,446,025 B2 | 11/2008 | Cohen et al. | |
| 7,462,774 B2 | 12/2008 | Roscheisen | |
| 7,471,428 B2 | 12/2008 | Ohara | |
| 7,491,269 B2 | 2/2009 | Legagneux | |
| 7,521,322 B2 | 4/2009 | Tang et al. | |
| 7,598,482 B1 | 10/2009 | Verhulst | |
| 7,622,367 B1 | 11/2009 | Nuzzo | |
| 7,646,138 B2 | 1/2010 | Williams | |
| 7,646,943 B1 | 1/2010 | Wober | |
| 7,647,695 B2 | 1/2010 | MacNutt | |
| 7,655,860 B2 | 2/2010 | Parsons | |
| 7,663,202 B2 | 2/2010 | Wang et al. | |
| 7,704,806 B2 | 4/2010 | Chae et al. | |
| 7,713,779 B2 | 5/2010 | Firon | |
| 7,719,688 B2 | 5/2010 | Kamins | |
| 7,732,839 B2 | 6/2010 | Sebe et al. | |
| 7,736,954 B2 | 6/2010 | Hussain et al. | |
| 7,740,824 B2 | 6/2010 | Godfried | |
| 7,790,495 B2 | 9/2010 | Assefa et al. | |
| 7,888,155 B2 | 2/2011 | Chen | |
| 8,035,184 B1 | 10/2011 | Dutta et al. | |
| 8,049,203 B2 * | 11/2011 | Samuelson et al. | 257/9 |
| 8,063,450 B2 | 11/2011 | Wernersson et al. | |
| 8,093,675 B2 | 1/2012 | Tsunemi et al. | |
| 8,242,353 B2 | 8/2012 | Karg | |
| 2002/0020846 A1 | 2/2002 | Pi et al. | |
| 2002/0104821 A1 | 8/2002 | Bazylenko | |
| 2002/0109082 A1 | 8/2002 | Nakayama | |
| 2002/0172820 A1 | 11/2002 | Majumdar | |
| 2003/0003300 A1 | 1/2003 | Korgel | |
| 2003/0006363 A1 | 1/2003 | Campbell | |
| 2003/0077907 A1 | 4/2003 | Kao et al. | |
| 2003/0089899 A1 | 5/2003 | Lieber | |
| 2003/0103744 A1 | 6/2003 | Koyama | |
| 2003/0132480 A1 | 7/2003 | Chau | |
| 2003/0189202 A1 | 10/2003 | Li | |
| 2003/0227090 A1 | 12/2003 | Okabe | |
| 2004/0026684 A1 | 2/2004 | Empedocles | |
| 2004/0058058 A1 | 3/2004 | Shchegolikhin | |
| 2004/0065362 A1 | 4/2004 | Watabe | |
| 2004/0075464 A1 | 4/2004 | Samuelson | |
| 2004/0118337 A1 | 6/2004 | Mizutani | |
| 2004/0122328 A1 | 6/2004 | Wang | |
| 2004/0124366 A1 | 7/2004 | Zeng | |
| 2004/0155247 A1 | 8/2004 | Benthien | |
| 2004/0180461 A1 | 9/2004 | Yaung | |
| 2004/0213307 A1 | 10/2004 | Lieber | |
| 2004/0217086 A1 | 11/2004 | Kawashima | |
| 2004/0223681 A1 | 11/2004 | Block | |
| 2004/0241965 A1 | 12/2004 | Merritt | |
| 2005/0082676 A1 | 4/2005 | Andry | |
| 2005/0095699 A1 | 5/2005 | Miyauchi et al. | |
| 2005/0116271 A1 | 6/2005 | Kato | |
| 2005/0133476 A1 | 6/2005 | Islam | |
| 2005/0190453 A1 | 9/2005 | Dobashi | |
| 2005/0201704 A1 | 9/2005 | Ellwood | |
| 2005/0218468 A1 | 10/2005 | Owen | |
| 2005/0284517 A1 | 12/2005 | Shinohara | |
| 2006/0113622 A1 | 6/2006 | Adkisson | |
| 2006/0121371 A1 | 6/2006 | Wu | |
| 2006/0146323 A1 | 7/2006 | Bratkovski | |
| 2006/0260674 A1 | 11/2006 | Tran | |
| 2006/0273262 A1 | 12/2006 | Sayag | |
| 2006/0273389 A1 | 12/2006 | Cohen | |
| 2006/0284118 A1 | 12/2006 | Asmussen | |
| 2007/0012985 A1 | 1/2007 | Stumbo | |
| 2007/0023799 A1 | 2/2007 | Boettiger | |
| 2007/0025504 A1 | 2/2007 | Tumer | |
| 2007/0029545 A1 | 2/2007 | Striakhilev | |
| 2007/0052050 A1 | 3/2007 | Dierickx | |
| 2007/0082255 A1 | 4/2007 | Sun | |
| 2007/0099292 A1 | 5/2007 | Miller | |
| 2007/0104441 A1 | 5/2007 | Ahn et al. | |
| 2007/0108371 A1 | 5/2007 | Stevens | |
| 2007/0114622 A1 | 5/2007 | Adkisson | |
| 2007/0120254 A1 | 5/2007 | Hurkx et al. | |
| 2007/0126037 A1 | 6/2007 | Ikeda | |
| 2007/0137697 A1 | 6/2007 | Kempa | |
| 2007/0138376 A1 | 6/2007 | Naughton | |
| 2007/0138380 A1 | 6/2007 | Adkisson | |
| 2007/0138459 A1 | 6/2007 | Wong | |
| 2007/0140638 A1 | 6/2007 | Yang | |
| 2007/0145512 A1 | 6/2007 | Rhodes | |
| 2007/0148599 A1 | 6/2007 | True | |
| 2007/0152248 A1 | 7/2007 | Choi | |
| 2007/0155025 A1 | 7/2007 | Zhang | |
| 2007/0170418 A1 | 7/2007 | Bowers | |
| 2007/0172623 A1 | 7/2007 | Kresse | |
| 2007/0187787 A1 | 8/2007 | Ackerson | |
| 2007/0196239 A1 | 8/2007 | Vink | |
| 2007/0200054 A1 | 8/2007 | Reznik | |
| 2007/0205483 A1 | 9/2007 | Williams | |

| | | |
|---|---|---|
| 2007/0217754 A1 | 9/2007 | Sasaki |
| 2007/0228421 A1 | 10/2007 | Shioya et al. |
| 2007/0238285 A1 | 10/2007 | Borden |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2008/0001498 A1 | 1/2008 | Muller |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun et al. |
| 2008/0145965 A1 | 6/2008 | Reznik |
| 2008/0149944 A1 | 6/2008 | Samuelson |
| 2008/0166883 A1 | 7/2008 | Liu et al. |
| 2008/0169017 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwat et al. |
| 2009/0032687 A1 | 2/2009 | Lapstun |
| 2009/0046749 A1 | 2/2009 | Mizuuchi |
| 2009/0050204 A1 | 2/2009 | Habib |
| 2009/0057650 A1 | 3/2009 | Lieber |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0165844 A1 | 7/2009 | Dutta |
| 2009/0173976 A1 | 7/2009 | Augusto |
| 2009/0179289 A1 | 7/2009 | Park |
| 2009/0188552 A1 | 7/2009 | Wang |
| 2009/0189144 A1 | 7/2009 | Quitoriano et al. |
| 2009/0189145 A1 | 7/2009 | Want et al. |
| 2009/0199597 A1 | 8/2009 | Danley |
| 2009/0201400 A1 | 8/2009 | Zhang et al. |
| 2009/0224245 A1 | 9/2009 | Umezaki |
| 2009/0233445 A1 | 9/2009 | Lee |
| 2009/0243016 A1 | 10/2009 | Kawahara et al. |
| 2009/0244514 A1 | 10/2009 | Jin |
| 2009/0260687 A1 | 10/2009 | Park |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0104494 A1 | 4/2010 | Meng |
| 2010/0116976 A1 | 5/2010 | Wober |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu et al. |
| 2010/0163714 A1 | 7/2010 | Wober |
| 2010/0163941 A1 | 7/2010 | Jung |
| 2010/0187404 A1 | 7/2010 | Klem |
| 2010/0200065 A1 | 8/2010 | Choi |
| 2010/0207103 A1* | 8/2010 | Farrow et al. ............ 257/24 |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0282314 A1 | 11/2010 | Coakley |
| 2010/0295019 A1 | 11/2010 | Wang et al. |
| 2010/0304061 A1 | 12/2010 | Ye et al. |
| 2010/0308214 A1 | 12/2010 | Wober |
| 2010/0320444 A1 | 12/2010 | Dutta |
| 2011/0036396 A1 | 2/2011 | Jayaraman |
| 2011/0037133 A1 | 2/2011 | Su et al. |
| 2011/0080508 A1 | 4/2011 | Katsuno et al. |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu |
| 2011/0253982 A1 | 10/2011 | Wang et al. |
| 2011/0272014 A1 | 11/2011 | Mathai et al. |
| 2011/0309237 A1 | 12/2011 | Seo et al. |
| 2011/0315988 A1 | 12/2011 | Yu et al. |
| 2011/0316106 A1 | 12/2011 | Kim |
| 2012/0009714 A1 | 1/2012 | Mouli |

FOREIGN PATENT DOCUMENTS

| | | |
|---|---|---|
| JP | 2007201091 | 8/2007 |
| WO | 8603347 | 6/1986 |
| WO | 0002379 | 1/2000 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

Gadelrab et al., The Source-Gated Amorphous Silicon Photo-Transistor, IEEE Transactions on Electron Devices, Oct. 1997, vol. 44, No. 10, pp. 1789-1794.

Guillaumée, et al., Polarization Sensitive Silicon Photodiodes Using Nanostructured Metallic Grids, Applied Physics Letters 94, 2009.

Junger, et. al., Polarization- and wavelength-sensitive sub-wavelength structures fabricated in the metal layers of deep submicron CMOS processes, Proc. of SPIE, vol. 7712, 2010.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loose et al., CMOS Detector Technology, Scientific Detector Workshop, Sicily, 2005, Experimental Astronomy, vol. 19, Issue 1-3, pp. 111-134.

Sarkar et. al., Integrated polarization-analyzing CMOS image sensor for detecting incoming light ray direction, Sensors Application Symposium (SAS) p. 194-199, 1010 IEEE.

Ye et al., Fabrication Techniques of High Aspect Ratio Vertical Lightpipes Using a Dielectric Photo Mask, SPIE, Proceedings, Feb. 2010, vol. 7591.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

"CMOS image sensor pixel optical efficiency and optical crosstalk optimization using FDTD Solutions" www.lumerical.com/fdtd_microlens/cmos_image_sensor_pixel microlens.php, Mar. 19, 2009.

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.

Baillie et al., 'Zero-space microlenses for CMOS image sensors: optical modeling and lithographic process development', Publication Date May 2004, http://adsabs.harvard.edu/abs/2004SPIE.5377.. 953B, pp. 1-2.vbTab.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol., 76, No. 15 (Apr. 10, 2000), pp. 2068-2070.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, 2008, vol. 19, No. 25.

Furumiya, et al. "High-sensitivity and no-crosstalk pixel technology for embedded CMOS image sensor"; IEEE Electron Device Letters, vol. 48, No. 10, Oct. 2001.

Gambino et al., 'CMOS Imager with Copper Wiring and Lightpipe,' Electron Devices Meeting, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

Ge et al., Orientation-Controlled Growth of Single-Crystal Silicon-Nanowire Arrays, Advanced Materials, Jan. 18, 2005, vol. 17, No. 1, pp. 56-61.

Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.

Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.

Hochbaum et al., Controlled Growth of Si Nanowire Arrays for Device Integration, Nano Letters, Mar. 2005, vol. 5, No. 3, pp. 457-460.

Holmes et al., Control of Thickness and Orientation of Solution-Grown Silicon Nanowires, Science, Feb. 25, 2000, vol. 287, No. 5457, pp. 1471-1473.

International Preliminary Report on Patentability for PCT International Patent Application No. PCT/U62009/055963, mailed Mar. 17, 2011.

International Search Report and Written Opinion for PCT International Application No. PCT/US2010/035722, mailed Jul. 20, 2010.

International Search Report and Written Opinion for PCT International Application No. PCT/US2010/035726, mailed Jul. 21, 2010.

International Search Report and Written Opinion for PCT International Application No. PCT/US2010/057227, mailed Jan. 26, 2011.

International Search Report and Written Opinion for PCT International Patent Application No. PCT/US2009/055963, mailed Oct. 15, 2009.vbTab.

International Search Report and Written Opinion for PCT International Patent Application No. PCT/US2010/035727, mailed Sep. 27, 2010.

International Search Report and Written Opinion for PCT International Patent Application No. PCT/US2010/051435, mailed Dec. 3, 2010.

International Search Report and Written Opinion for PCT International Patent Application No. PCT/US2010/059468, mailed Feb. 11, 2011.

International Search Report and Written Opinion for PCT International Patent Application No. PCT/US2010/059491, mailed Feb. 9, 2011.

International Search Report and Written Opinion for PCT International Patent Application No. PCT/US2010/059501, mailed Feb. 15, 2011.

International Search Report and Written Opinion for PCT International Patent Application No. PCT/US2010/059504, mailed Apr. 7, 2011.

Jin-Kon Kim; 'New Functional Nanomaterials Based on Block Copolymers' http://www.ziu.edu.cn/adver/subjectizyhd/jz0707061313.html.

Kalkofen et al., Atomic Layer Deposition of Boron Oxide As Dopant Source for Shallow Doping of Silicon,Meeting Abstract 943, 217th ECS Meeting, MA2010-01, Apr. 25-30, 2010, Vancouver Canada, EI—Advanced Gate Stack, Source / Drain, and Channel Engineering for Si-Based CMOS 6: New Materials, Processes, and Equipment.

Kane, Why Nanowires Make Great Photodetectors, EurekAlert.com article, Apr. 25, 2007.

Kempa, Thomas J. et al. Single and Tandem Axial p-i-n Nanowire Photovoltaic Devices. Nano Letters. 2008, vol. 8, No. 10, 3456-3460.

Kim et al., Electronic Structure of Vertically Aligned Mn-Doped $CoFe_2O_4$ Nanowires and Their Application as Humidity Sensors and Photodetectors, Journal of Physical Chemistry C, Apr. 7, 2009.

Law, et al., 'Semiconductor Nanowires and Nanotubes'; Annu. Rev. Mater. Res. 2004, 34:83-122.

Lee et al., Vertical Pillar-Superlattice Array and Graphene Hybrid Light Emitting Diodes, Nano Letters, 2010, vol. 10, pp. 2783-2788.

Loncar et al., Diamond Nanotechnology, SPIE Newsroom, May 18, 2010, obtained at url: <http://spie.org/x40194.xml?ArticleID=x40194>.

Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.

Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.

Madou, Properties and Growth of Silicon, Including Crystalline Silicon, Fundamentals of Microfabrication, 2nd Ed., CRC Press, 2002, pp. 125-204.

Morales et al., A Laser Ablation Method for the Synthesis of Crystalline Semiconductor Nanowires, Science, Jan. 9, 1998, vol. 279, pp. 208-211.

N.L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.

Ozgur Yavuzcetin, et al.; 'Index-tuned Anti-reflective Coating using a Nanostructured Metamaterial'; http://www.umass.edu/research/rld/bioportal/vuewtech.php?tid=40.

Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.

Parraga et al., Color and Luminance Information in Natural Scenes, Journal of Optical Society of America A, Optics, Image, Science and Vision, Jun. 1998, vol. 15, No. 6.

Reynard Corporation; 'Anti-Reflection Coatings (AR)', http://www.reynardcorp.com/coating_anti_reflection.php.

Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.

Rugani, First All-Nanowire Sensor, Technology Review, Aug. 13, 2008, Published by MIT.

Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.

Shimizu et al., Homoepitaxial Growth of Vertical Si Nanowires on Si(100) Substrate using Anodic Aluminum Oxide Template, (abstract only), Materials Research Society.

Song et al., Vertically Standing Ge Nanowires on GaAs(110) Substrates, Nanotechnology 19, Feb. 21, 2008.

T. H. Hsu, et al. 'Light Guide for Pixel Crosstalk Improvement in Deep Submicron CMOS Image Sensor'; IEEE Electron Device Letters, vol. 25, No. 1, Jan. 2004.

Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.

Tseng, et al. 'Crosstalk improvement technology applicable to 0.14μm CMOS image sensor'; IEEE International Electron Devices Meeting, Dec. 13-15, 2004; IEDM Technical Digest, pp. 997-1000. vbTab.

Verheijen, Marcel A. et al. Growth Kinetics of Heterostructured GaP-GaAs Nanowires. J. Am. Chem. Soc. 2006, 128, 1353-1359.

Wagner, R.S. and Ellis, W.C. Vapor-Liquid-Solid Mechanism of Single Crystal Growth. Applied Physics Letters. vol. 4, No. 5 (Mar. 1, 1964), pp. 89-90.

Wong et al., Lateral Nanoconcentrator Nanowire Multijunction Photovoltaic Cells, GCEP Progress report, Apr. 20, 2009, pp. 1-18.

Zhang et al., Ultrahigh Responsivity Visible and Infrared Detection Using Silicon Nanowire Phototransistors, Nanoletters, May 14, 2010, vol. 10, No. 6, pp. 2117-2120.

International Search Report and Written Opinion for PCT International Patent Application No. PCT/US2010/051446, mailed Jan. 3, 2011.

International Search Report and Written Opinion for PCT International Patent Application No. PCT/US2009/063592, mailed Jan. 13, 2010.

William Shockley and H. Queisser, Detailed Balance Limit of Efficiency of p-n Junction Solar Cells, J. of Appl. Physics, Mar. 1961, 32(3).

International Preliminary Report on Patentability for PCT International Application No. PCT/US2010/035722, mailed Nov. 3, 2011.

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

International Preliminary Report and Written Opinion re PCT/US2010/059491, mailed Jun. 21, 2012.

International Search Report and Written Opinion re PCT/US2011/57325, mailed Jun. 22, 2012.

International Preliminary Report and Written Opinion re PCT/US2010/059468, mailed Jun. 21, 2012.

International Preliminary Report and Written Opinion re PCT/US2010/059504, mailed Jun. 21, 2012.

International Preliminary Report and Written Opinion re PCT/US2010/059496, mailed Jun. 21, 2012.

U.S. Office Action for U.S. Appl. No. 12/573,582, dated Jun. 28, 2012.

Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.

Nguyen et al., Deep Reactive Ion etching of Polyimide for Microfluidic Applications, Journal of the Korean Physical Society, Sep. 2007, vol. 51, No. 3, pp. 984-988.

Makarova et al., Fabrication of High Density, High-Aspect-Ratio Polyimide Nanofilters, Journal of Vacuum Science and Technology, Nov./Dec. 2009, vol. 27, No. 6., pp. 2585-2587.

Wang, Introduction to Nanotechnology—Where Opportunities arise & Great Future Being Built from Small Things.

Thelander et al., Nanowire-Based One-Dimensional Electronics, Materials Today, Oct. 2006, vol. 9, No. 10, pp. 28-35.

Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.

Schmidt et al., Realization of a Silicon Nanowire Vertical Surround-Gate Field-Effect Transistor, Small, Jan. 2006, vol. 2, No. 1, pp. 85-88.

U.S. Office Action for U.S. Appl. No. 13/494,661, notification date Nov. 7, 2012.

Baomin Wang and Paul W. Leu, Nanotechology 23 (2012) 194003, 7 pages.

Sangmoo Jeon, et al., Nano Lett. 2012, 12, 2971-2976.

Sangmoo Jeong et al., J. Vac. Sci. Technol. A 30(6), Nov./Dec. 2012.

Sarkar et. al., Integrated polarization-analyzing CMOS image sensor for detecting incoming light ray direction, Sensors Application Symposium (SAS), Mar. 29, 2012, p. 194-199, 1010 IEEE.

Jin-Kon Kim; 'New Functional Nanomaterials Based on Block Copolymers' http://www.ziu.edu.cn/adver/subjectizyhd/jz0707061313.html, Jul. 7, 2011.

Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.

Reynard Corporation; 'Anti-Reflection Coatings (AR)', http://www.reynardcorp.com/coating_anti_reflection.php, undated.

Shimizu et al., Homoepitaxial Growth of Vertical Si Nanowires on Si(100) Substrate using Anodic Aluminum Oxide Template, (abstract only), Materials Research Society, Fall 2007.

Wang, Introduction to Nanotechnology—Where Opportunities arise & Great Future Being Built from Small Things, Fall 2008.

* cited by examiner

VERTICALLY STRUCTURED PASSIVE PIXEL ARRAYS AND METHODS FOR FABRICATING THE SAME

CROSS-REFERENCE TO RELATED APPLICATIONS

This application is related to U.S. patent application Ser. Nos. 12/204,686 (granted as U.S. Pat. No. 7,646,943), 12/648,942, 12/270,233, 12/472,264, 12/472,271, 12/478,598, 12/573,582, 12/575,221, 12/633,323, 12/633,318, 12/633,313, 12/633,305, 12/621,497, 12/633,297, 61/266,064, 61/357,429, 61/306,421, 61/306,421, 12/945,492, 12/910,664, 12/966,514, 12/966,535, 12/966,573 and 12/967,880, the disclosures of which are hereby incorporated by reference in their entirety.

BACKGROUND

An image sensor may be fabricated to have a large number (e.g. more than 1 million) of sensor elements (pixels) arranged in a defined pattern (e.g. a square grid). The pixels may be photodiodes, charge-coupled devices (CCD) or other photosensitive elements, that are adapted to convert electromagnetic radiation (e.g. visible light, infrared light) into electrical signals.

Recent advances in semiconductor technologies have enabled the fabrication of nanostructures, such as nanotubes, nanocavities, and nanowires. Among them, nanowires have drawn a lot of interest because of their usefulness as sensor elements in an image sensor. For instance, U.S. Patent Application Publication No. 2004/0075464 discloses a plurality of devices based on nanowires, herein incorporated by reference in its entirety. Discrete electronic devices such as transistors, photodiodes and photoconductors have been made successfully from nanostructures. It has been a challenge, however, to integrate and position such discrete electronic devices based on nanostructures in a functional apparatus, especially in a way that each of such devices can be individually controlled and addressed.

U.S. patent application Ser. Nos. 12/633,313 filed Dec. 8, 2009, and 12/575,221 filed Oct. 7, 2009, describe two methods for achieving this goal, which are herein incorporated by reference in their entirety. The first method includes forming a Cartesian (x-y) matrix wiring (e.g. aluminum) first and to then forming a nanowire array thereon. This method begins with a fabrication of a substrate which provides an x-y matrix wiring and components employing a conventional complementary metal-oxide-semiconductor (CMOS) fabrication process. Nanowires are then grown using a Vapor-Liquid-Solid (VLS) method in designated locations. However, the VLS growth generally requires temperatures that tend to damage the wiring and components on the substrate and tend to undesirably disturb pre-existing doping profile in the substrate.

The second method includes forming a nanowire array first by either a VLS growth or an etching method. Then, an x-y matrix of wiring is fabricated to electrically connect each nanowire in the nanowire array to external circuitry. This method requires nanoscale lithography on a non-planar surface.

Described hereinbelow are devices and methods of manufacturing the same, which include controlled integration of individually addressable nanostructures such as nanowires and nanopillars into a functional apparatus such as an image sensor, without the abovementioned problems.

SUMMARY

Described herein is an image sensor comprising a substrate; a plurality of pixels each of which has at least one nanopillar essentially extending vertically from the substrate, and a gate electrode surrounding the at least one nanopillar; wherein the at least one nanopillar is adapted to convert light impinging thereon to electrical signals and the gate electrode is operable to pinch off or allow current flow through the at least one nanopillar; wherein the at least one nanopillar has a cladding, a refractive index of the cladding being smaller than a refractive index of the nanopillar. The term "cladding" as used herein means a layer of substance surrounding the nanopillars. A refractive index of the cladding is preferably smaller than a refractive index of the nanopillars.

The image sensor can further comprise a plurality of readout lines, each of which electrically connected to one or more pixels; and a plurality of gate lines, each of which electrically connected to the gate electrode of one or more pixels, wherein no two pixels are connected to a same readout line and their gate electrodes are connected to a same gate line.

The image sensor can comprise first, second, third and fourth pixels, a first readout line electrically connected to the first and second pixels, a second readout line electrically connected to the third and fourth pixels, a first gate line electrically connected to the gate electrodes of the first and third pixels and a second gate line electrically connected to the gate electrodes of the second and fourth pixels.

The image sensor can comprise at least one pixel comprising at least first, second, and third nanopillars having a size effective to absorb and/or detect light of about 650 nm, 510 nm and 475 nm in wavelength, respectively.

The image sensor can comprise at least one pixel comprising at least first, second, third and fourth nanopillars having a size effective to absorb and/or detect light of red, green, green and blue light, respectively.

In an embodiment, the readout lines comprise a heavily doped semiconductor material; each of the nanopillars comprises a body of an intrinsic semiconductor material or lightly doped semiconductor material of the same conduction type as the heavily doped semiconductor material of the readout lines, and a junction layer of the opposite conduction type from the heavily doped semiconductor material of the readout lines; the body of each nanopillar is sandwiched between one of the readout lines and the junction layer of the nanopillar; the junction layers of all the nanopillars are electrically connected to a transparent conductive layer; and the nanopillars are epitaxial with the readout lines.

According to one embodiment, an apparatus can comprise the image sensor, a decoder connected to each gate line, and a trans-impedance amplifier and multiplexer circuit connected to each readout line.

According to one embodiment, an apparatus can comprise the image sensor, foreoptics and a readout circuit.

One method of manufacturing the image sensor includes steps of forming nanopillars by deep etching a silicon-on-insulator or silicon-on-glass type of substrate. Another method of manufacturing the image sensor includes steps of growing nanopillars by a VLS method.

Other features of one or more embodiments of this disclosure will seem apparent from the following detailed description, and accompanying drawings, and the appended claims.

According to an embodiment, an image sensor comprising, a substrate; a plurality of pixels each of which has at least one nanopillar essentially extending vertically from the substrate, and a gate electrode surrounding the at least one nanopillar; wherein the at least one nanopillar is adapted to convert light impinging thereon to electrical signals and the gate electrode is operable to pinch off or allow current flow through the at least one nanopillar. The term "image sensor" as used herein means a device that converts an optical image to an electric signal. An image sensor can be used in digital cameras and other imaging devices. Examples of image sensors include a charge-coupled device (CCD) or a complementary metal-oxide-semiconductor (CMOS) active pixel sensor. The term nanowires "extending essentially perpendicularly from the substrate" as used herein means that angles between the nanowires and the substrate are from 85° to 90°. The term "nanopillar" as used herein means a structure that has a size constrained to at most 1000 nm in two dimensions and unconstrained in the other dimension. The term "nanopillar" can also mean a structure that has a size constrained to at most 10 microns in two dimensions and unconstrained in the other dimension. The term "gate electrode" as used herein means an electrode operable to control electrical current flow by a voltage applied on the gate electrode.

According to an embodiment, each of the nanopillars has a vertical p-n junction or a vertical p-i-n junction. The term "p-i-n junction" as used herein means a structure of a lightly doped or intrinsic semiconductor region sandwiched between a p-type semiconductor region and an n-type semiconductor region. The p-type and n-type regions can be heavily doped for Ohmic contacts. The term "p-n junction" as used herein means a structure with a p-type semiconductor region and an n-type semiconductor region in contact with each other.

According to an embodiment, more than one pixels have a common electrode electrically connected thereto. The term "pixel" as used herein means the smallest addressable light-sensing element of an image sensor. Each pixel is individually addressable. Pixels in an image sensor can be arranged in a two-dimensional grid. Each pixel samples characteristics such as intensity and color of a small area of an image projected onto the image sensor. The color sampled by a pixel can be represented by three or four component intensities such as red, green, and blue, or cyan, magenta, yellow, and black, or cyan, magenta, yellow, and green. Many image sensors are, for various reasons, not capable of sensing different colors at the same location.

According to an embodiment, the common electrode is a transparent conductive material.

According to an embodiment, the nanopillars and the substrate comprise one or more semiconductor materials and/or metals.

According to an embodiment, diameters of the nanopillars are from 10 to 2000 nm, 50 to 150 nm, or 90 to 150 nm; and/or lengths of the nanopillars are from 10 to 10000 nm or 100 to 1000 nm; and/or cross-sectional shapes of the nanopillars are circles, squares or hexagons.

According to an embodiment, the nanopillars are sized to selectively absorb UV light (light of wavelengths from about 10 to about 400 nm), red light (light of wavelengths from about 620 to about 750 nm), green light (light of wavelengths from about 495 to about 570 nm), blue light (light of wavelengths from about 450 to about 475 nm), or IR light (light of wavelengths from about 0.78 to about 1000 microns).

According to an embodiment, the image sensor further comprises a plurality of readout lines, each of which electrically connected to one or more pixels; and a plurality of gate lines, each of which electrically connected to the gate electrode of one or more pixels, wherein no two pixels are connected to a same readout line and their gate electrodes are connected to a same gate line. The term "readout lines" as used herein means an electrode or a conductor line operable to transmit an electrical signal.

According to an embodiment, the image sensor comprises first, second, third and fourth pixels, a first readout line electrically connected to the first and second pixels, a second readout line electrically connected to the third and fourth pixels, a first gate line electrically connected to the gate electrodes of the first and third pixels and a second gate line electrically connected to the gate electrodes of the second and fourth pixels. The term "gate line" as used herein means an electrode or a conductor line operable to transmit an electrical signal to the gate electrodes.

According to an embodiment, the readout lines and the gate lines have one or more electronic devices connected thereto, the one or more electronic devices are selected from the group consisting of amplifiers, multiplexers, D/A or A/D converters, computers, microprocessing units, and digital signal processors. The term "amplifier" as used herein means any device that changes, usually increases, the amplitude of a signal. The term "multiplexer" as used herein means a device that performs multiplexing; it selects one of many analog or digital input signals and forwards the selected input into a single line. An analog-to-digital converter (abbreviated ADC, A/D or A to D) is a device that converts a continuous quantity to a discrete digital number. A digital-to-analog converter (DAC or D-to-A) is a device that converts a digital (usually binary) code to an analog signal (current, voltage, or electric charge).

According to an embodiment, the readout lines comprise a heavily doped semiconductor material; each of the nanopillars comprises a body of an intrinsic semiconductor material or lightly doped semiconductor material of the same conduction type as the heavily doped semiconductor material of the readout lines, and a junction layer of the opposite conduction type from the heavily doped semiconductor material of the readout lines; the body of each nanopillar is sandwiched between one of the readout lines and the junction layer of the nanopillar; the junction layers of all the nanopillars are electrically connected to a transparent conductive layer; and the nanopillars are epitaxial with the readout lines. An intrinsic semiconductor, also called an undoped semiconductor or i-type semiconductor, is a pure semiconductor without any significant dopant species present.

According to an embodiment, a method of using the image sensor comprises: (a) applying a bias voltage to the transparent conductive layer; (b) applying a first gate voltage to all the gate lines, the first gate voltage being effective to pinch off electrical current through the nanopillars; (c) exposing the image sensor to light; (d) connecting all the readout lines to ground to remove accumulated electrical charge thereon, then disconnecting all the readout lines from the ground; (e) applying a second gate voltage to one of the gate lines, the second gate voltage being effective to allow electrical current through the nanopillars this one gate line surrounds; (f) taking a current reading on at least one of the readout lines; (g) applying the first gate voltage to this one gate line; (h) optionally repeating steps (d)-(g) on each gate line.

According to an embodiment, an apparatus comprises the image sensor, a decoder connected to each gate line, and a trans-impedance amplifier and multiplexer circuit connected to each readout line.

According to an embodiment, the trans-impedance amplifier and multiplexer circuit is functional to amplify an electrical current from each readout line and convert it into a voltage signal; the decoder and the trans-impedance amplifier and multiplexer circuit are synchronized by a common timing signal generated by a controller; and/or the decoder and the trans-impedance amplifier and multiplexer circuit are connected to the image sensor by wire-bonding, flip-chip bonding or bump bonding.

According to an embodiment, the readout lines are parallel or have a fan-out shape, and/or the gate lines are parallel or have a fan-out shape.

According to an embodiment, a method of using the image sensor to scan an object, comprises: converting reflected light from the object received by the pixels into analog electrical signals; amplifying the analog electrical signals; converting the amplified analog electrical signals to digital electrical signals using an analog-to-digital converter.

According to an embodiment, an apparatus comprises the image sensor, foreoptics, and a readout circuit, wherein the foreoptics are configured to receive light from a scene and focus or collimate the light onto the image sensor; and the readout circuit is connected to the image sensor and configured to receive output from the image sensor. The term "foreoptics" as used herein means optical components (e.g., lenses, mirrors) placed in an optical path before the image sensor.

According to an embodiment, the foreoptics comprise one or more of a lens, an optical filter, a polarizer, a diffuser, a collimator; and/or the readout circuit comprises one or more of ASICs, FPGAs, DSPs. An application-specific integrated circuit (ASIC) is an integrated circuit (IC) customized for a particular use, rather than intended for general-purpose use. A field-programmable gate array (FPGA) is an integrated circuit designed to be configured by the customer or designer after manufacturing—hence "field-programmable". A digital signal processor (DSP) is a specialized microprocessor with an optimized architecture for the fast operational needs of digital signal processing.

According to an embodiment, the image sensor comprises at least one pixel comprising at least first, second, and third nanopillars having a size effective to absorb and/or detect light of about 650 nm, 510 nm and 475 nm in wavelength, respectively.

According to an embodiment, the image sensor comprises at least one pixel comprising at least first, second, third and fourth nanopillars having a size effective to absorb and/or detect light of red, green, green and blue light, respectively.

According to an embodiment, the image sensor further comprises a cladding surrounding at least one of the pixels or at least one of the nanopillars.

According to an embodiment, the cladding is hafnium oxide or silicon nitride.

According to an embodiment, the image sensor further comprises a micro lens on an upper end of the at least one nanopillar.

According to an embodiment, the at least one nanopillar has an absorptance of at least 50% across an entire wavelength range from 400 nm to 800 nm.

DETAILED DESCRIPTION

Figure 1:
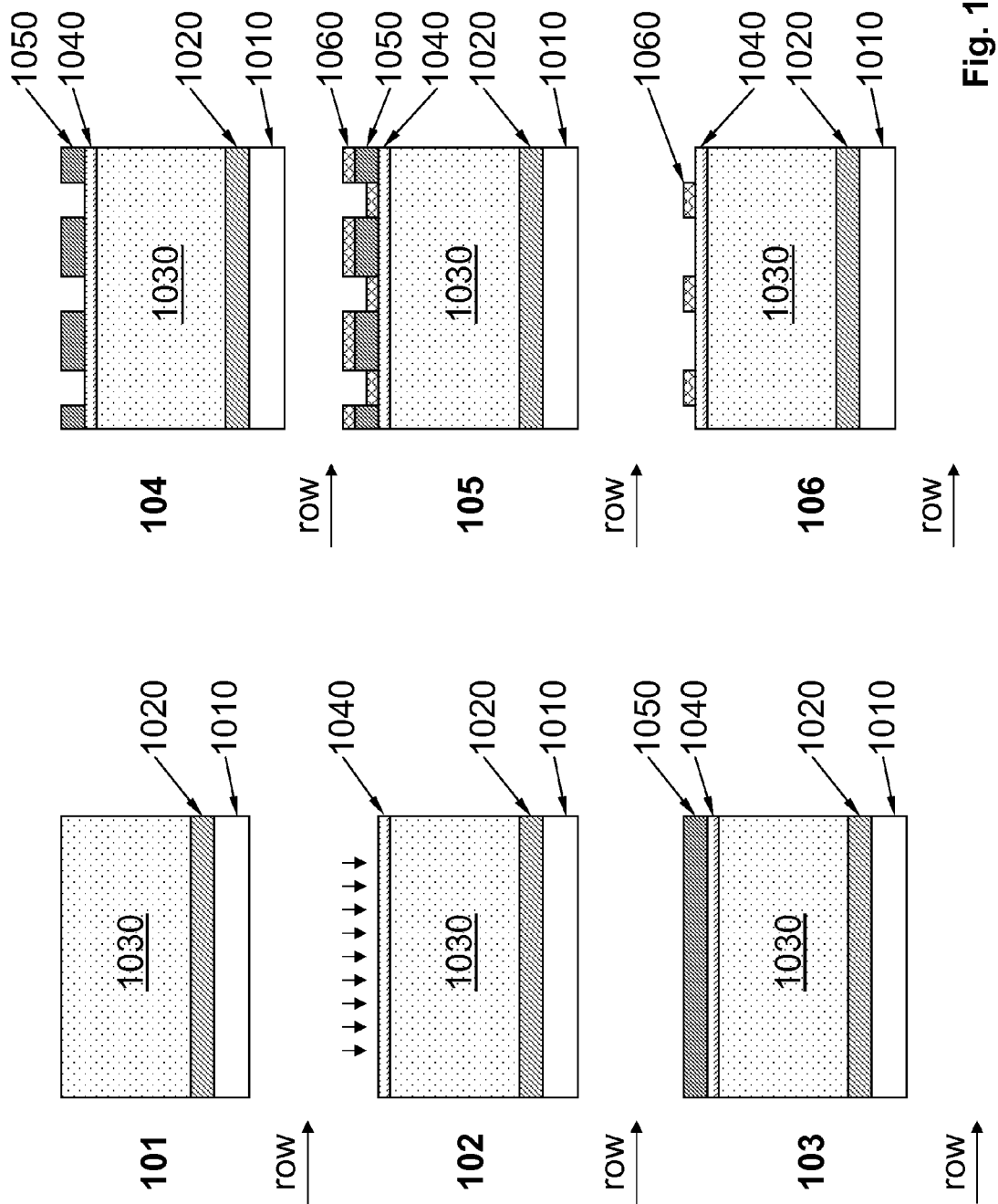
FIG. 1 shows a method for fabricating the image sensor including steps of deep etching, according to an embodiment.
Figure 1:
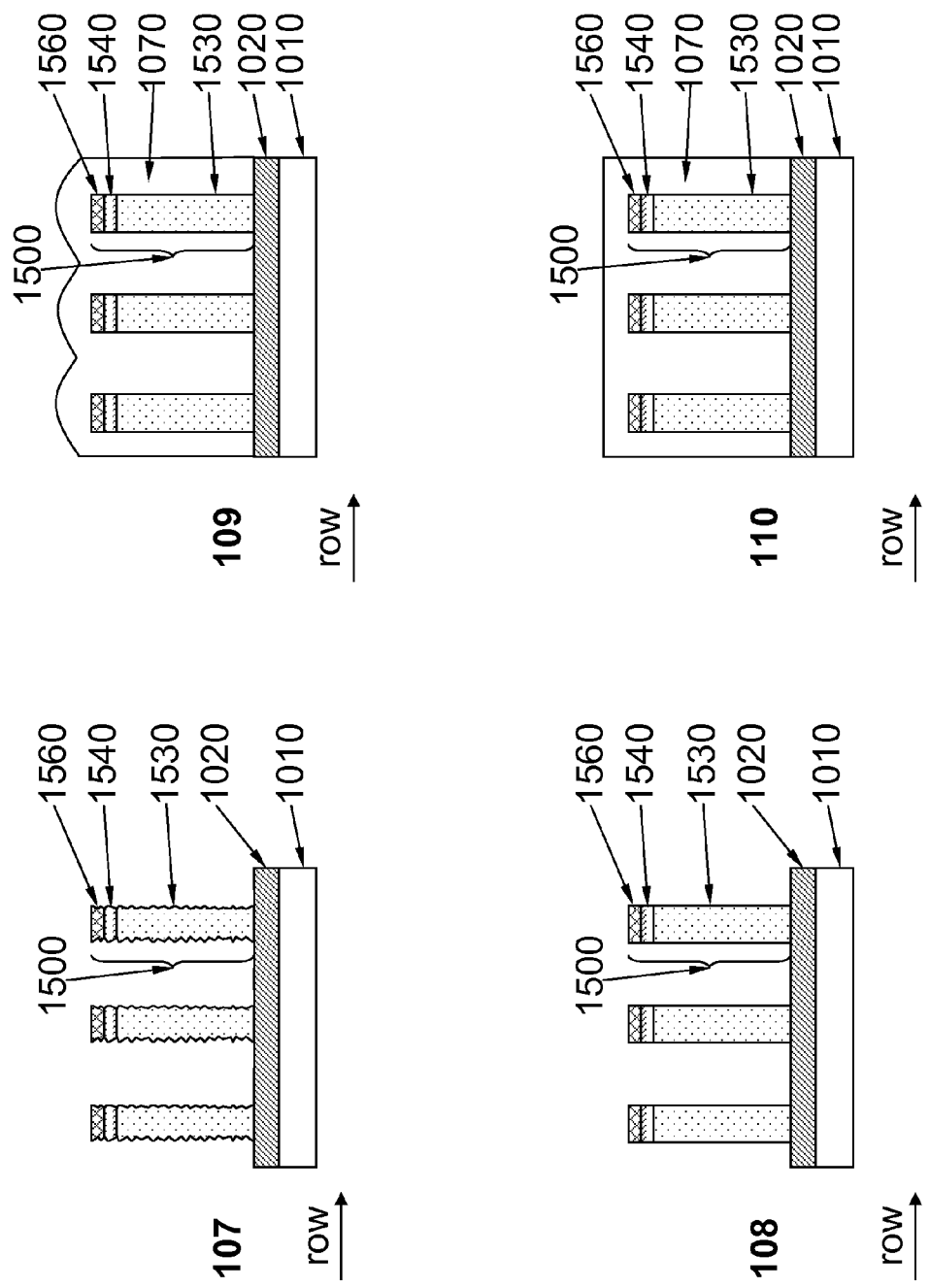
Figure 1:
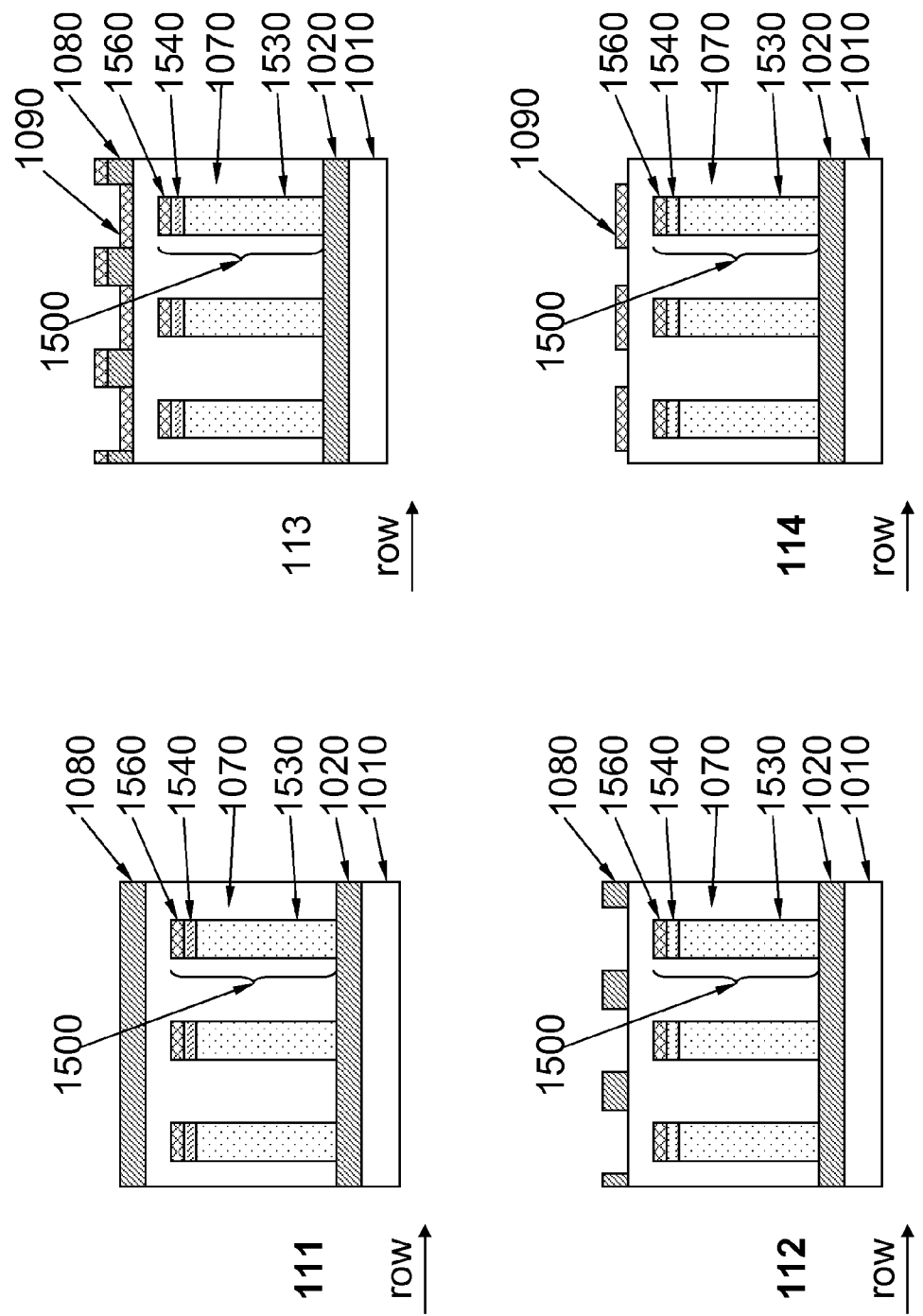
Figure 1:
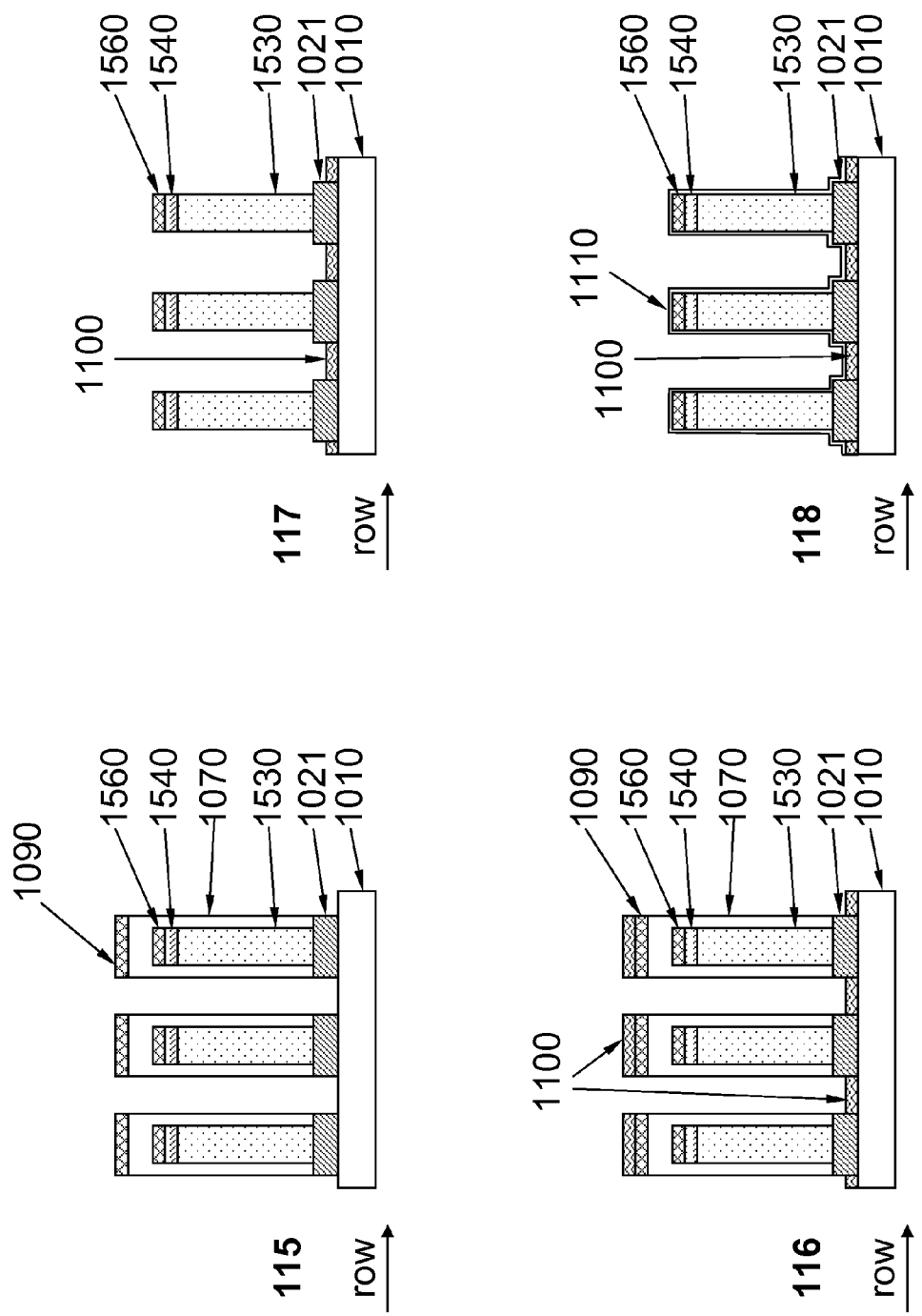
Figure 1:
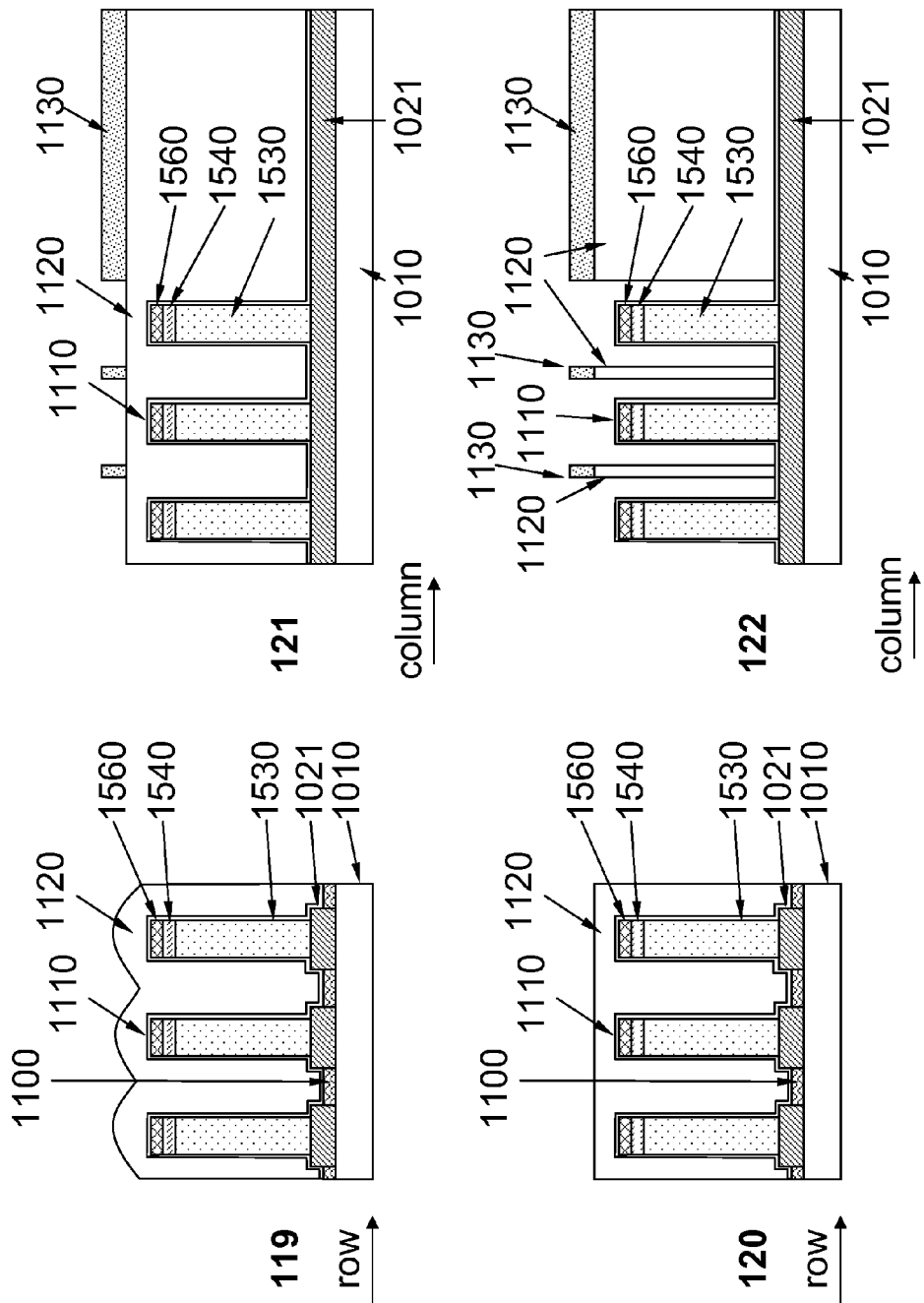
Figure 1:
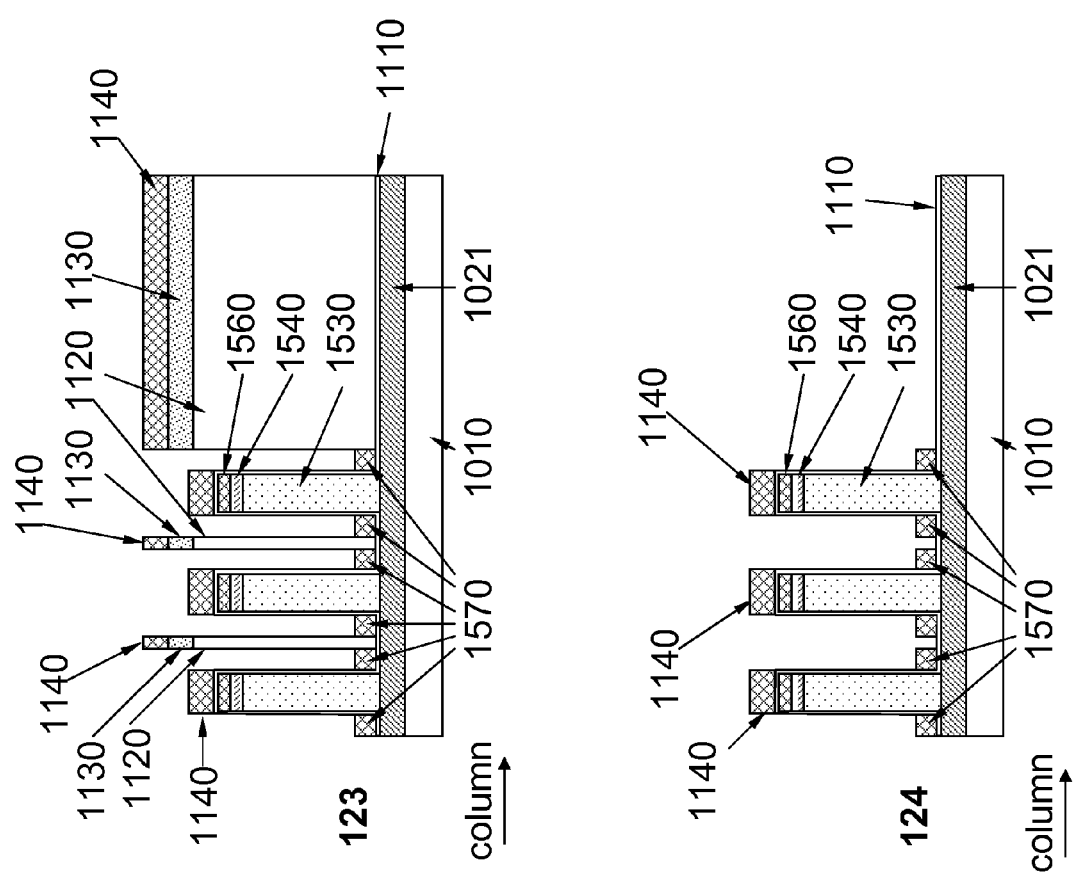
Figure 1:
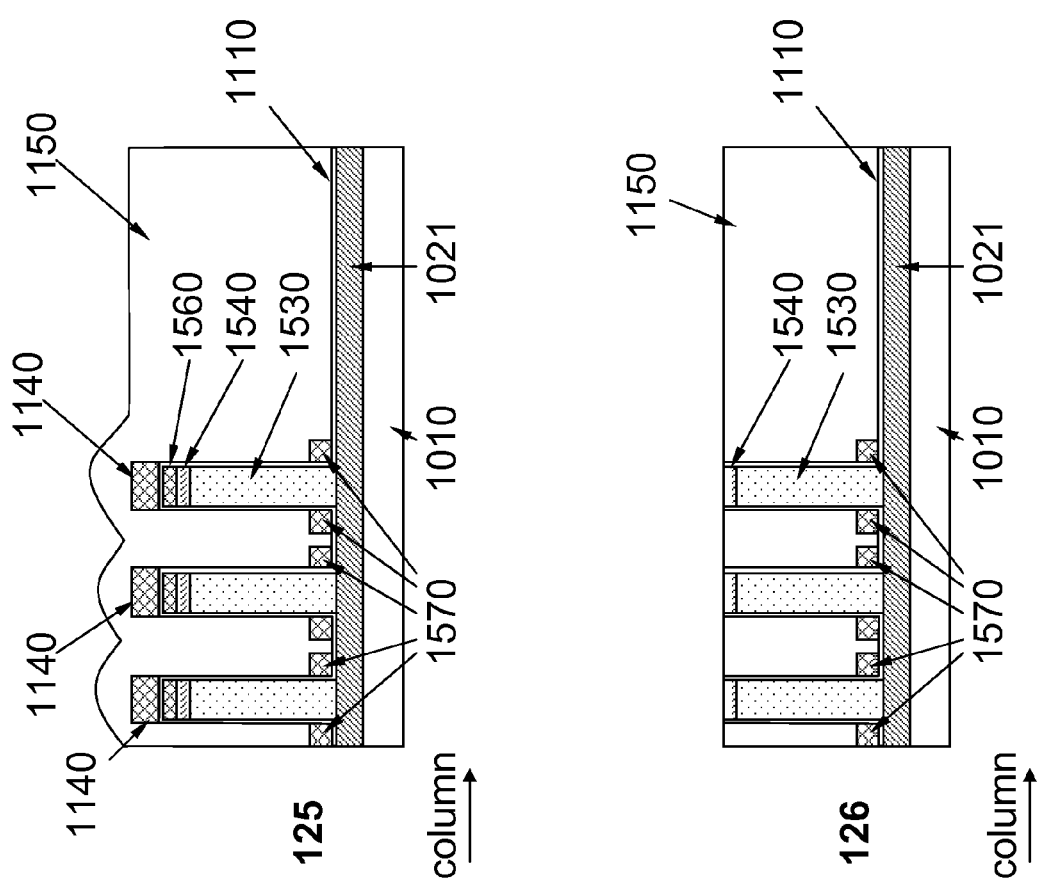
Figure 1:
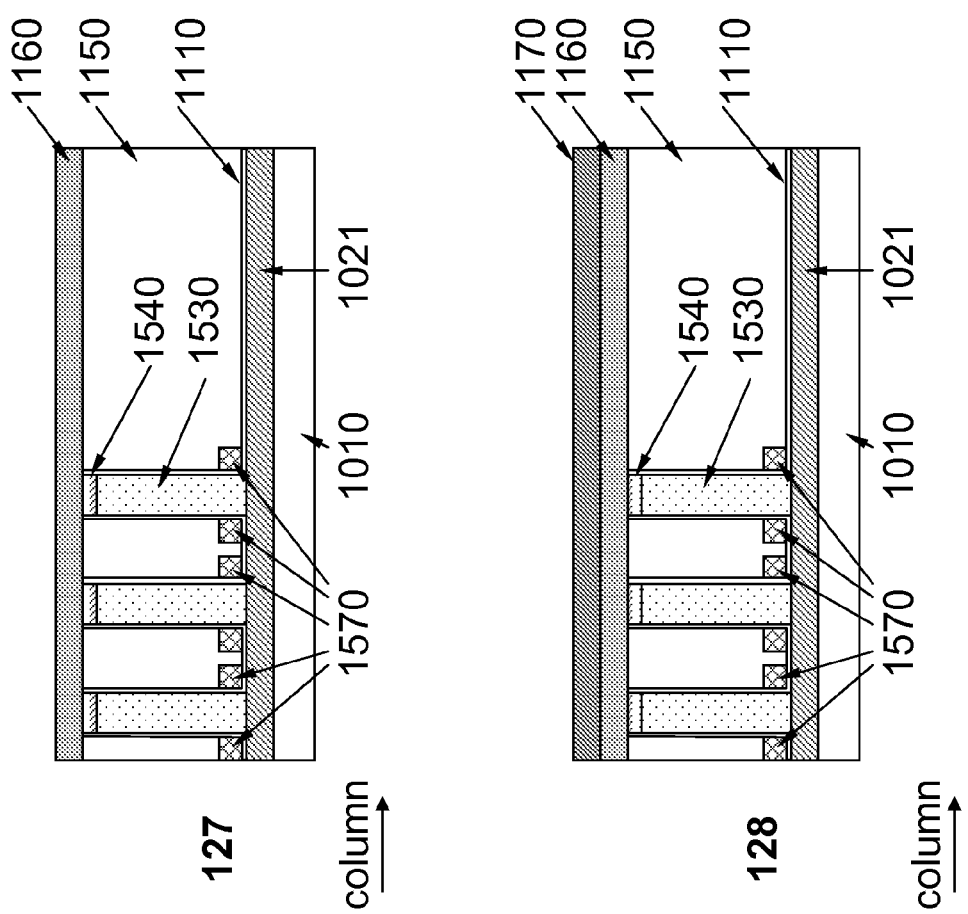
Figure 1:
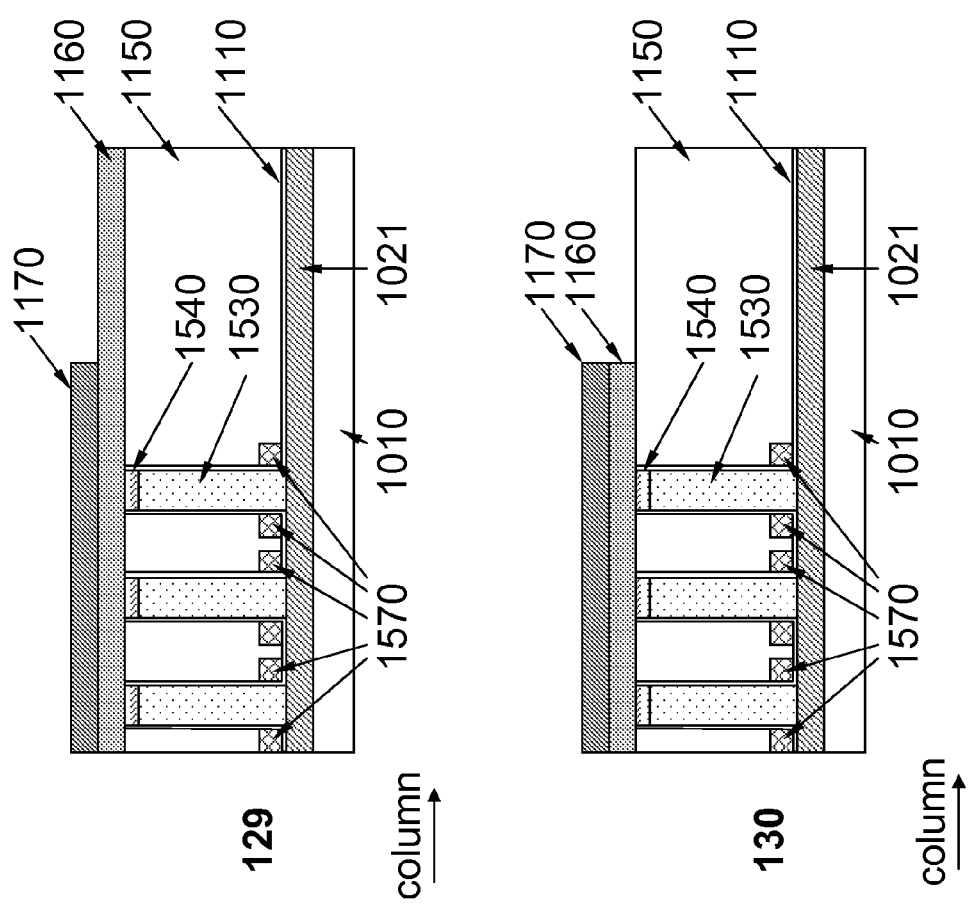
Figure 1:
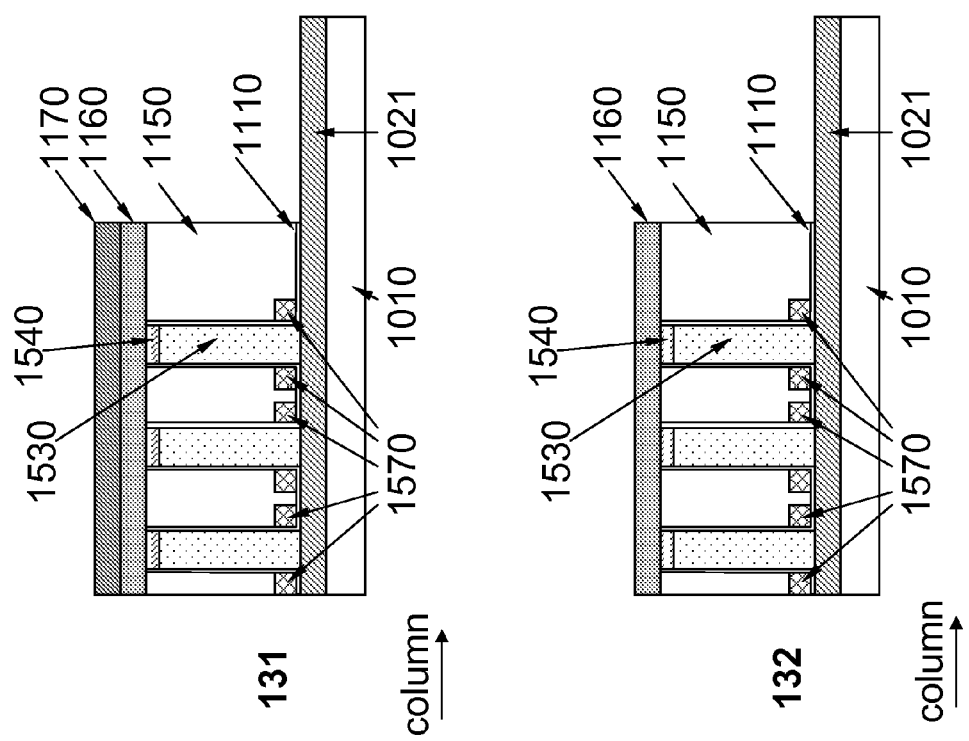

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

This disclosure is drawn to, among other things, methods of use, methods of fabrication, apparatuses, systems, and devices relating to an image sensor, each pixel of which has at least a nanopillar that can convert light impinging thereon to electrical signals (e.g. a nanopillar having a vertical p-n or p-i-n junction) and a gate electrode surrounding the nanopillar preferably near its lower end (i.e. the end connected to a substrate). The gate electrode may be located at another location of the nanopillar. The gate electrodes are functional to individually electrically connect the nanopillars to or disconnect the nanopillars from external readout circuitry. The pixels can be arranged in any suitable pattern such as a square grid, a hexagonal grid, and concentric rings. The pixels can be fabricated to absorb light in the ultraviolet (UV), visible (VIS) or infrared (IR) regions and to generate a detectable electrical signal in response thereto.

The nanopillars essentially extend vertically from the substrate, which can also be referred to as "standing-up".

The image sensor can be configured for various types of uses such as compact image sensors and spectrophotometers.

In one embodiment, the pixels are organized into a plurality of "rows". The pixels in each row are electrically connected in parallel to a readout line. Pixels in different rows are electrically connected to different readout lines. The pixels can be organized into a plurality of "columns" such that the gate electrodes of the pixels in each column are electrically connected in parallel to a gate line, the gate electrodes of the pixels in different columns are electrically connected to different gate lines, and no two different pixels are connected to a same readout line and their gate electrodes are connected to a same gate line. The terms "row" and "column" do not require that pixels are physically aligned or arranged in any particular way, but rather are used to describe topological relationship between the pixels, readout lines and gate lines. An exemplary image sensor according to this embodiment comprises first, second, third, fourth pixels, each of which has a gate electrode, a first readout line electrically connected to the first and second pixels, a second readout line electrically connected to the third and fourth pixels, a first gate line electrically connected to the gate electrodes of the first and third pixels and a second gate line electrically connected to the gate electrodes of the second and fourth pixels.

In one embodiment, each pixel has at least one nanopillar, which comprises a p-n or p-i-n junction extending in the length direction of the nanopillar. The nanopillars in the pixels can be configured to absorb, confine and transmit light impinging thereon. For example, the nanopillars can function as waveguides to confine and direct light in a direction determined by its physical boundaries.

In one embodiment, more than one pixels can have a common electrode electrically connected thereto, for example, for providing a bias voltage. The common electrode can be a top layer made of a transparent conductive material, such as ITO (indium tin oxide) or aluminum doped ZnO (AZO).

In one embodiment, the readout lines and the gate lines can have suitable electronic devices connected thereto, such as, amplifiers, multiplexers, D/A or A/D converters, computers, microprocessing units, digital signal processors, etc.

In one embodiment, the nanopillars and the substrate can comprise suitable semiconductor materials and/or metals such as Si, GaAs, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (In-SnO). The nanopillars and the substrate can be doped by suitable dopants such as GaP, Te, Se, S, Zn, Fe, Mg, Be, Cd, etc. It should be noted that the use nitrides such as $Si_3N_4$, GaN, InN and AlN can facilitate fabrication of image sensors that can detect light in wavelength regions not easily accessible by conventional techniques. Doping levels of the nanopillars and the substrate can be up to $10^{20}$ atoms/$cm^3$. Other suitable materials are possible.

Methods of fabrication of the image sensor can include shallow trench isolation (STI), also known as "Box Isolation Technique." STI is generally used on CMOS process technology nodes of 250 nanometers and smaller. Older CMOS technologies and non-MOS technologies commonly use isolation based on Local Oxidation of Silicon (LOCOS). STI is typically created early during the semiconductor device fabrication process, before transistors are formed. Steps of the STI process include, for instance, etching a pattern of trenches in the substrate, depositing one or more dielectric materials (such as silicon dioxide) to fill the trenches, and removing the excess dielectric using a technique such as chemical-mechanical planarization.

The nanopillars can be formed by a dry etching process, such as a deep etching process, or a Bosch process, in combination with a suitable lithography technique (e.g. photolithography, e-beam lithography, holographic lithography). The nanopillars can also be formed by a Vapor Liquid Solid (VLS) method. Diameters of the nanopillars can be from 10 to 2000 nm, preferably 50 to 150 nm, more preferably 90 to 150 nm. Lengths of the nanpillars can be from 10 nm to 10000 nm, preferably 1000 nm to 8000 nm, more preferably 4000 nm to 6000 nm. The nanopillars can have any suitable cross-sectional shape such as a circle, a square, a hexagon.

The nanopillars can be sized to selectively absorb a wavelength region of interest, for instance, as described in co-pending U.S. Patent Application Ser. No. 61/357,429 filed Jun. 22, 2010, herein incorporation by reference in its entirety. Absorptance can be adjusted by varying the nanopillar spacing (pitch), particularly to near unity.

The nanopillars can have a cladding material. The nanopillars can selectively absorb UV light, red light, green light, blue light, or IR light.

The image sensor can have large number of nanopillars, for instance, a million or more.

FIG. 1 shows steps of a method of manufacturing the image sensor, according to an embodiment, using dry etching. In each step, a schematic cross section of the image sensor being manufactured is shown. The cross section can be along either a "row" direction or a "column" direction as explained below.

In step 101, a silicon-on-insulator (SOI)-type substrate or silicon-on-glass (SG)-type substrate is provided. The substrate has an oxide layer 1010, a heavily doped layer (HDL) 1020 on the layer 1010 and an epi layer 1030 on the HDL layer 1020. The HDL layer 1020 can be about 500 nm thick; epi layer 1030 can be about 3000 to 10000 nm thick. The substrate can have the following doping profiles: (i) the HDL layer 1020 is p+ (i.e. heavily doped to p type), the epi layer 1030 is p− (i.e. lightly doped to p type); (ii) the HDL layer 1020 p+, the epi layer 1030 is i (i.e. intrinsic); (iii) the HDL layer 1020 is n+ (i.e. heavily doped to n type), the epi layer 1030 is n− (i.e. light doped to n type); or (iv) the HDL layer 1020 is n+, the epi layer 1030 is i.

In step 102, a junction layer 1040 is formed on the epi layer 1030 by ion implantation. The junction layer 1040 is of the opposite conduction type as the HDL layer 1020, i.e. if the HDL 1020 is p type, the junction layer 1040 is n type; if the HDL 1020 is n type, the junction layer 1040 is p type. The junction layer 1040 is made "shallow" (i.e. thin) by using very low implantation energy. For example, the thickness of the junction layer 1040 is from 10 to 200 nm. The junction layer 1040, the epi layer 1030 and the HDL layer 1020 form a p-i-n, p-n, n-i-p, or n-p junction, depending on the doping profile.

In step 103, a layer of resist 1050 is applied on the junction layer 1040. The resist layer 1050 can be applied by spin coating. The resist layer 1050 can be a photo resist or an e-beam resist.

In step 104, lithography is performed. The resist layer 1050 now has a pattern of openings in which the junction layer 1040 is exposed. The openings are preferably dots, squares or circles in shape. Shapes and locations of the openings correspond to the shapes and locations of the nanopillars of the image sensor being manufactured. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 105, a mask layer 1060 is deposited. The deposition can be done using a technique such as thermal evaporation, e-beam evaporation, sputtering, atomic layer deposition (ALD), plasma-enhanced chemical vapor deposition (PECVD). The mask layer 1060 can be a metal such as Cr or Al, or a dielectric such as $SiO_2$ or $Si_3N_4$. The thickness of the mask layer can be determined by desired etching depth in step 107 and etching selectivity.

In step 106, remainder of the resist layer 1050 is lift off by a suitable solvent or ashed in a resist asher to remove any mask layer 1060 support thereon. A portion of the mask layer 1060 in the openings of the resist layer 1050 is retained. A portion of the junction layer 1040 is now exposed through the retained mask layer 1060.

In step 107, the exposed portion of the junction layer 1040 and the portion of the epi layer 1030 directly therebelow are deep etched until the HDL layer 1020 directly below the exposed portion of the junction layer 1040 is exposed, to form nanopillars 1500. Each nanopillar 1500 now has a mask layer 1560 which is part of the mask layer 1060, a junction layer 1540 which is part of the junction layer 1040 and an epi layer 1530 which is a part of the epi layer 1030. Deep etching includes alternating deposition and etch steps and leads "scalloping" on sidewalls of the nanopillars 1500, i.e. the sidewalls of the nanopillars 1500 are not smooth. The deep etching can use gases such as $C_4F_8$ and $SF_6$.

In step 108, the sidewalls of the nanopillars 1500 are smoothed by dipping the image sensor in an etchant such as potassium hydroxide (KOH) followed by rinsing.

In step 109, space between the nanopillars 1500 is filled by an oxide or a polymer 1070 such as silicon oxide or polyimide by a suitable technique such as chemical vapor deposition (CVD), drop casting, evaporation or spin coating.

In step 110, an upper surface of the oxide or polymer 1070 is planarized by a suitable technique such as chemical mechanical polishing/planarization (CMP). The mask layer 1560 of the nanopillars 1500 should not be exposed.

In step 111, another layer of resist 1080 is applied on the oxide or polymer 1070. The resist layer 1080 can be applied by spin coating. The resist layer 1080 can be a photo resist or an e-beam resist.

In step 112, lithography is performed. The resist layer 1080 now has a pattern of openings in which the oxide or polymer 1070 is exposed. The openings preferably are parallel slots extending across the entire width of the substrate. Each nanopillar 1500 entirely falls into the extent of one of the openings. All the nanopillars 1500 in the extent of the same opening will be later electrically connected to the same readout line. The shapes and locations of the openings correspond to the shapes and locations of the readout lines.

In step 113, a mask layer 1090 is deposited. The deposition can be done using a technique such as thermal evaporation, e-beam evaporation, sputtering, atomic layer deposition (ALD), plasma-enhanced chemical vapor deposition (PECVD). The mask layer 1090 can be a metal such as Cr or Al, or a dielectric such as $SiO_2$ or $Si_3N_4$. The thickness of the mask layer can be determined by desired etching depth in step 115 and etching selectivity.

In step 114, remainder of the resist layer 1080 is lift off by a suitable solvent or ashed in a resist asher to remove any mask layer 1090 support there on. A portion of the mask layer 1090 in the openings of the resist layer 1080 is retained. A portion of the oxide or polymer 1070 is now exposed between the retained mask layer 1090.

In step 115, the exposed portion of the oxide or polymer 1070 and the portion of the HDL layer 1020 directly therebelow are deep etched until the layer 1010 directly below the exposed portion of the oxide or polymer 1070 is exposed. The HDL layer 1020 is now segmented into readout lines 1021. A cross section along the length of the readout lines 1021 is referred to as along the "column" direction.

In step 116, a shield layer 1100 is deposited by a technique such as thermal evaporation or e-beam evaporation, to shield the exposed portion of the layer 1010. The shield layer 110 can be $Si_3N_4$.

In step 117, removing the oxide or polymer 1070 using a suitable method such as dissolving in a suitable etchant (e.g. HF, tetramethylammonium hydroxide) or dry etching. The nanopillars 1500 are now exposed.

In step 118, a passivation layer 1110 is deposited by an isotropic deposition technique such as ALD to cover the entire exposed surfaces of the image sensor. This passivation layer 1110 will function as gate dielectric of the gate electrodes. The passivation layer 1110 can be $SiO_2$, $Si_3N_4$, $ZrO_2$, $HfO_2$, $Al_2O_3$, etc. Materials with high dielectric constants such as $ZrO_2$ and $HfO_2$ are preferred.

In step 119, space between the nanopillars 1500 is filled by an oxide or a polymer 1120 such as silicon oxide or polyimide by a suitable technique such as chemical vapor deposition (CVD), drop casting, evaporation or spin coating.

In step 120, an upper surface of the oxide or polymer 1120 is planarized by a suitable technique such as CMP. The passivation layer 1110 should not be exposed or damaged.

The image sensor in steps 121 through 132 is shown in a cross section along the "column" direction.

In step 121, a patterned mask layer 1130 is deposited on the oxide or polymer 1120 using lithography and lift-off, similar to steps 111 to 114. The patterned mask layer 1130 has openings in which the oxide or polymer 1120 is exposed. Each nanopillar 1500 entirely falls into the extent of one of the openings in the patterned mask layer 1130. Shapes and locations of the openings correspond to shapes and locations of the gate lines and gate electrodes. Gate electrodes of all the nanopillars 1500 in the extent of the same opening will be later electrically connected to the same gate line. No two nanopillars are connected to a same readout line and their gate electrodes are connected to a same gate line. The gate electrodes can be part of the gate lines.

In step 122, the exposed portion of the oxide or polymer 1120 is deep etched until the passivation layer 1110 directly therebelow is exposed.

In step 123, a metal layer 1140 is deposited using a technique such as thermal evaporation or e-beam evaporation. The portion of the metal layer 1140 deposited around the lower end of the nanopillars 1500 forms the gate electrodes and gate lines 1570. Each gate line 1570 is separated by the portion of the oxide or polymer 1120 directly below the patterned mask layer 1130. The metal layer 1140 can be Cr, Al, Au, Ag, Pt, Pd, doped poly-silicon, etc. A cross section along the length of the gate lines 1570 is referred to as along the "row" direction.

In step 124, removing the oxide or polymer 1120 using a suitable method such as dissolving in a suitable etchant (e.g. HF, tetramethylammonium hydroxide) or dry etching.

In step 125, space between the nanopillars 1500 is filled by an oxide or a polymer 1150 such as silicon oxide or polyimide by a suitable technique such as chemical vapor deposition (CVD), drop casting, evaporation or spin coating.

In step 126, an upper surface of the oxide or polymer 1150 is planarized by a suitable technique such as CMP until the junction layer 1540 of the nanopillars 1500 is exposed.

In step 127, a transparent conductive layer (TCL) 1160, such as ITO or aluminum doped zinc oxide (AZO) is deposited by a suitable technique such sputtering. Annealing may be performed to facilitate forming Ohmic contact between the TCL layer 1160 and the junction layer 1540 of the nanopillars 1500.

In step 128, a layer of resist 1170 s applied on the TCL layer 1160.

In step 129, lithography is performed. The resist layer 1170 now has an opening over an edge portion of the substrate. No nanopillars 1500 fall into the extent of the opening; a portion of each readout line 1021 falls into the extent of the opening; and a portion of each gate line 1570 falls into the extent of the opening. A portion of the TCL layer 1160 is exposed in the opening.

In step 130, the exposed portion of the TCL layer 1160 is removed by wet etch using a suitable etchant such as HCl. Now a portion of the oxide or polymer 1150 is exposed.

In step 131, the exposed portion of the oxide or polymer 1150 and the portion of the passivation layer 1110 directly therebelow are removed by dry etch. Now each readout line 1021 and each gate line 1570 has an exposed portion, for connecting to external circuitry.

In step 132, the resist layer 1170 is lift off by a suitable solvent or ashed in a resist asher.

Optionally, in one embodiment, micro lenses can be fabricated on upper ends of the nanopillars 1500 to enhance light collection. The micro lenses preferably have, convex upper surfaces, for instance, hemispherical or parabolic upper surfaces, and have a base corresponding to the pixel pitch. Other configurations are also possible.

An optional cladding material might also be deposited on the side surfaces of the nanopillars 1500. The cladding material can be hafnium dioxide or silicon nitride.

Figure 2C:
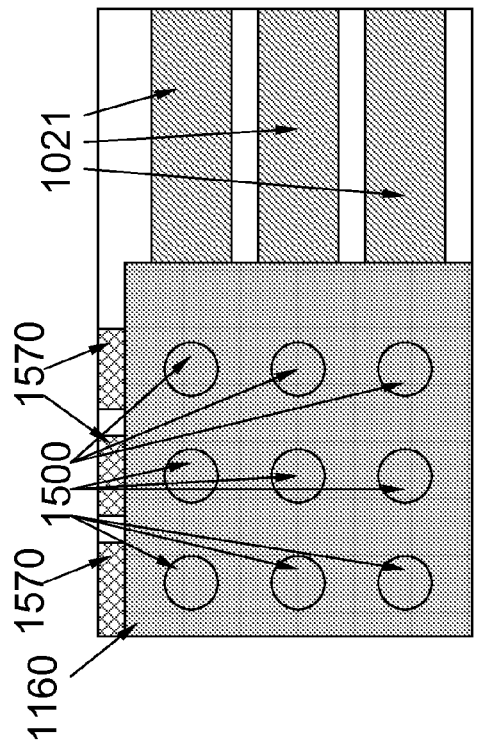
FIGS. 2A-2C show top views the image sensor at different stages during the method of FIG. 1.
Figure 2A:
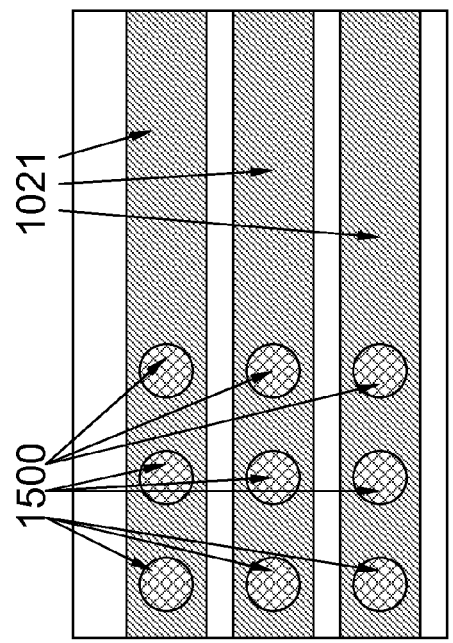

FIG. 2A shows a top view of the image sensor after step 120. The nanopillars 1500 are organized in "columns", i.e. all the nanopillars 1500 in the same column are electrically connected to the same readout line 1021.

Figure 2B:
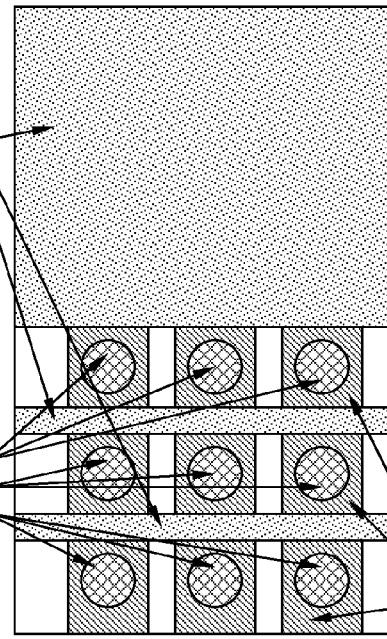

FIG. 2B shows a top view of the image sensor after step 122.

FIG. 2C shows a top view of the image sensor after step 132. Each readout line 1021 and each gate line 1570 has an exposed portion for connection to external circuitry.

Figure 3:
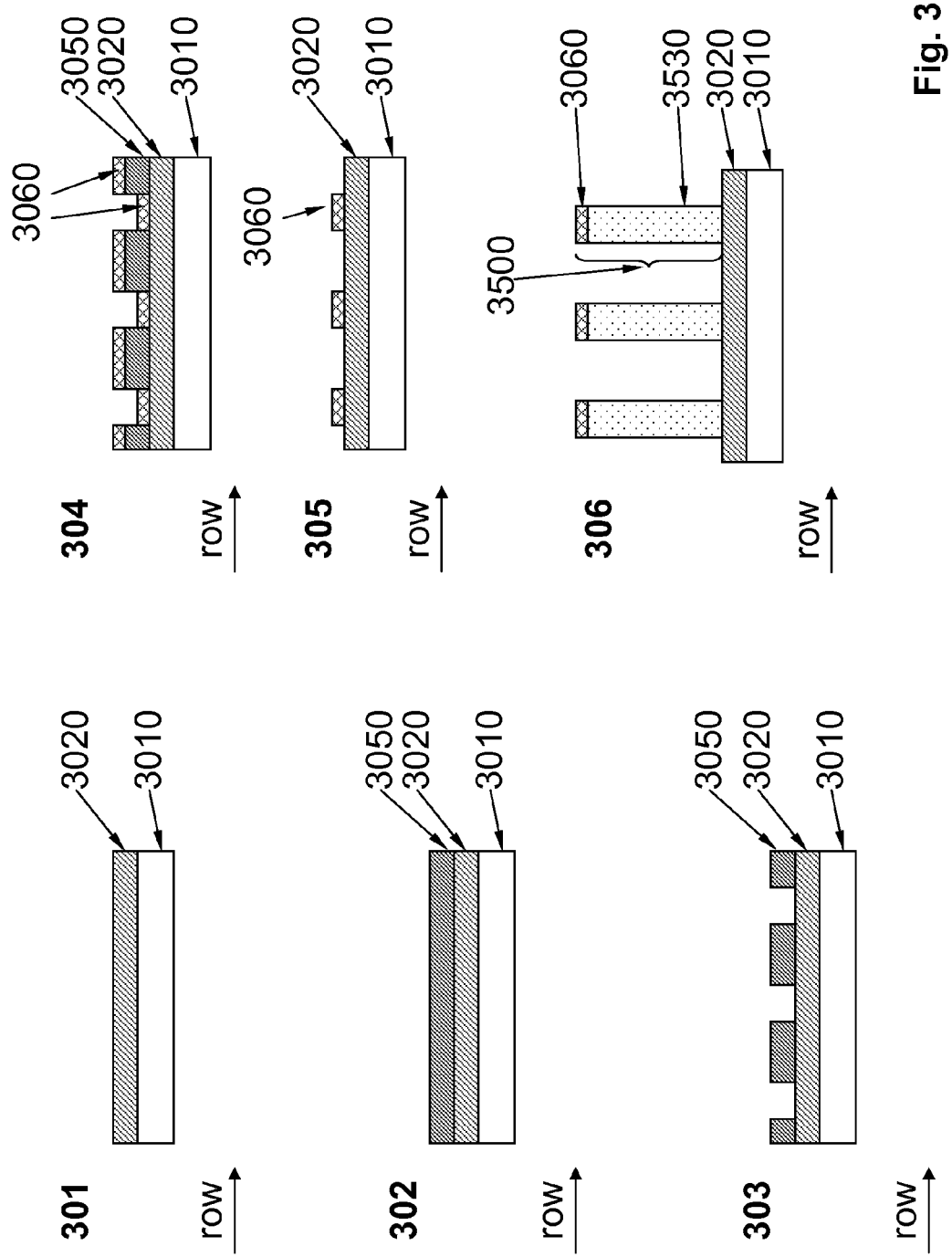
FIG. 3 shows a method for fabricating the image sensor including a VLS growth step, according to another embodiment.
Figure 3:
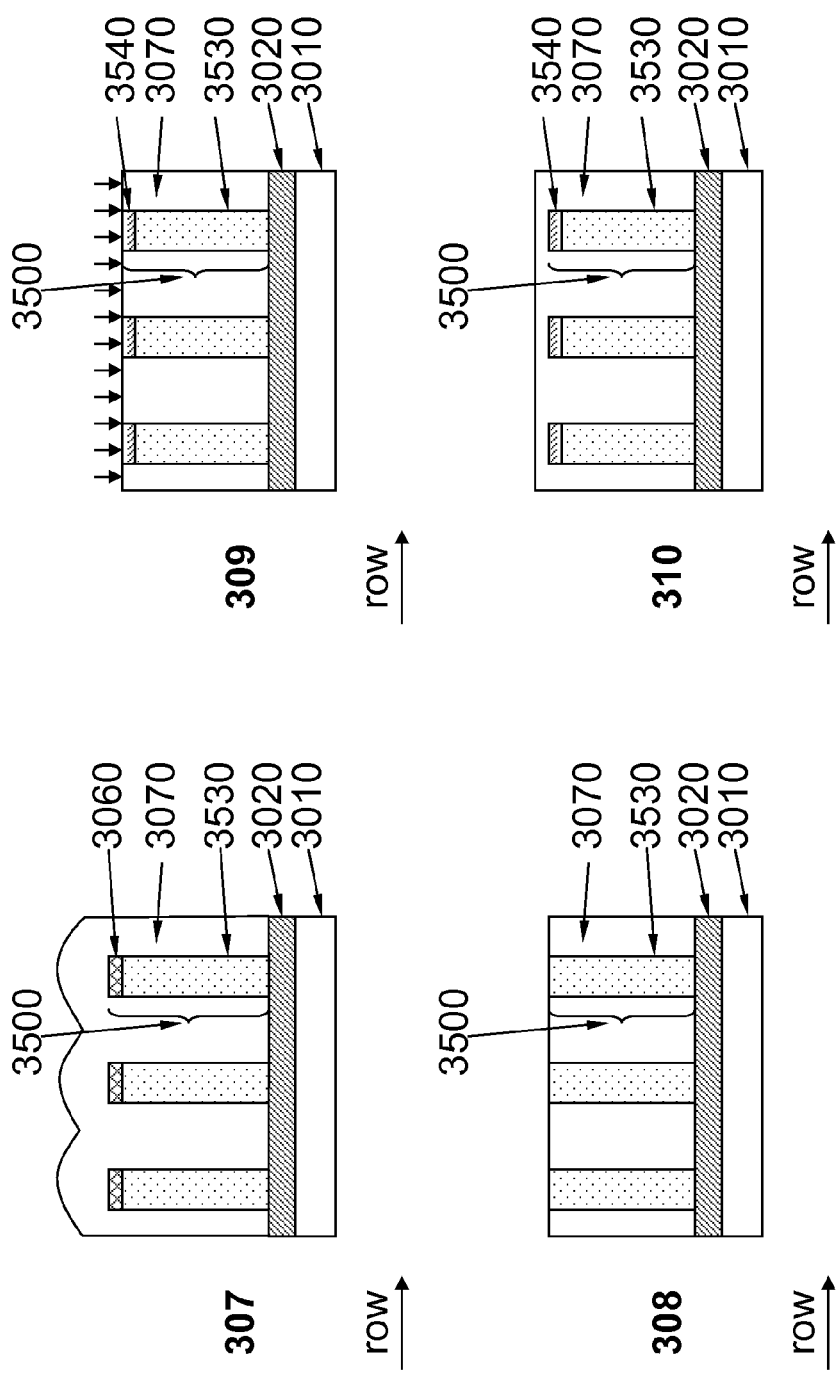

FIG. 3 shows steps of a method of manufacturing the image sensor, according to another embodiment, using the VLS method. In each step, a schematic cross section along the "row" direction or the "column" direction of the image sensor being manufactured is shown.

Details of the VLS method are described, for instance, in International Patent Application Publication No. WO2008/ 079076A1 and U.S. Patent Application Publication Nos. 200/ 80248304, 2008/0246123, 2008/0246020, and 2008/ 0237568, each of which is herein incorporation by reference in its entirety.

In step 301, a silicon-on-insulator (SOI)-type substrate or silicon-on glass (SG)-type substrate is provided. The substrate has an oxide layer 3010 and a heavily doped layer (HDL) 3020 on the layer 3010. The HDL layer 3020 can be about 500 nm thick. The HDL layer 3020 can be either p+ or n+.

In step 302, a layer of resist 3050 is applied on the HDL layer 3020. The resist layer 3050 can be applied by spin coating. The resist layer 3050 can be a photo resist or an e-beam resist.

In step 303, lithography is performed. The resist layer 3050 now has a pattern of openings in which the HDL layer 3020 is exposed. The openings are dots, squares or circles in shape, and correspond to the shapes and locations of the nanopillars of the image sensor being manufactured. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 304, a seed layer 3060 is deposited. The deposition can be done using a technique such as thermal evaporation, e-beam evaporation, sputtering, atomic layer deposition (ALD), plasma-enhanced chemical vapor deposition (PECVD). The seed layer 3060 can be a metal such as Au, Ag, Fe, Ni, Cr, Al or a combination thereof. The thickness of the seed layer 3060 can be from 1 nm to 10 nm.

In step 305, remainder of the resist layer 3050 is lift off by a suitable solvent or ashed in a resist asher to remove any seed layer 3060 support there on. A portion of the seed layer 3060 in the openings of the resist layer 3050 is retained.

In step 306, nanopillars 3500 are grown from the seed layer 3060 by the VLS method, wherein the seed layer 3060 functions as a catalyst. Preferably, the nanopillars 3500 are epitaxial with the underlying HDL layer 3020. After the VLS growth, each nanopillar 3500 now has a body 3530 and the seed layer 3060 thereon. The body 3530 is either i or lightly doped to the same conduction type as the HDL layer 3020, i.e. if the HDL layer 3020 is n type, the body 3530 should be n type; if the HDL layer 3020 is p type, the body 3530 should be p type. The length of the nanopillars 3500 can be determined by parameters of the VLS growth, such as length of time, temperature, gas flow rates, gas composition, etc.

In step 307, space between the nanopillars 3500 is filled by an oxide 3070 such as silicon oxide by a suitable technique such as chemical vapor deposition (CVD) or a polymer 3070 such as polyimide by a suitable technique such as drop casting, evaporation, CVD or spin coating. The space between the nanopillars 3500 can alternatively be filled by other suitable dielectric materials.

In step 308, an upper surface of the oxide or polymer 3070 is planarized by a suitable technique such as CMP, until the body 3530 of each nanopillar 3500 is exposed and the seed layer 3060 is entirely removed.

In step 309, a junction layer 3540 is formed on a top surface of each nanopillar 3500 by ion implantation. The junction layer 3540 is of the opposite conduction type as the HDL layer 3020, i.e. if the HDL 3020 is p type, the junction layer 3540 is n type; if the HDL 3020 is n type, the junction layer 3540 is p type. The junction layer 3540 is made "shallow" (i.e. thin) by using very low implantation energy. For example, the thickness of the junction layer 3540 is from 10 to 200 nm. The junction layer 3540, the body 3530 and the HDL layer 3020 form a p-i-n, p-n, n-i-p, or n-p junction, depending on the doping profile.

In step 310, covering the junction layer 3540 by depositing more of the oxide or polymer 3070.

Steps 311-332 are the same as steps 111-132 if FIG. 1.

A method of using the image sensor comprises: (a) exposing the pixels to light; (b) reading electrical signals from a pixel by connecting at least one nanopillar in the pixel to external readout circuitry using the gate electrode surrounding the at least one nanopillar of the pixel. The electrical signals can be electric charge accumulated on the nanopillar, a change of electrical current through the nanopillar, or a change of electrical impedance of the nanopillar.

A method of using the image sensor made by the method shown in FIG. 1 or FIG. 3, comprises: (a) applying a bias voltage to the TCL layer 1160; (b) applying a first gate voltage to all gate lines 1570, the first gate voltage being effective to pinch off electrical current through the nanopillars; (c) exposing the image sensor to light; (d) connecting all the readout lines 1021 to ground to remove accumulated electrical charge thereon, then disconnecting all the readout lines 1021 from the ground; (e) applying a second gate voltage to one of the gate lines 1570, the second gate voltage being effective to allow electrical current through the nanopillars this gate line 1570 surrounds; (f) taking a current reading on at least one of the readout lines 1021; (g) applying the first gate voltage to this gate line 1570; (h) optionally repeating steps (d)-(g) on each gate line 1570.

Figure 4:
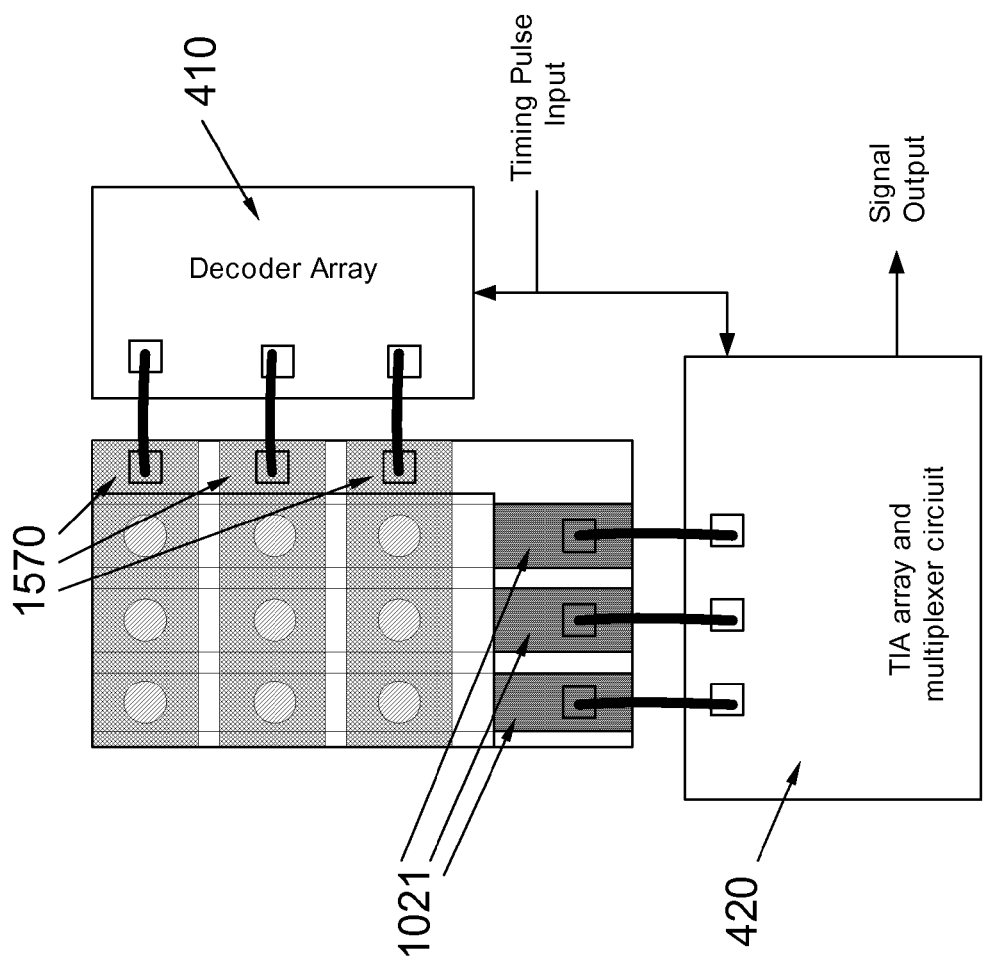
FIGS. 4 and 5 show an apparatus comprising the image sensor, according to an embodiment.
Figure 5:
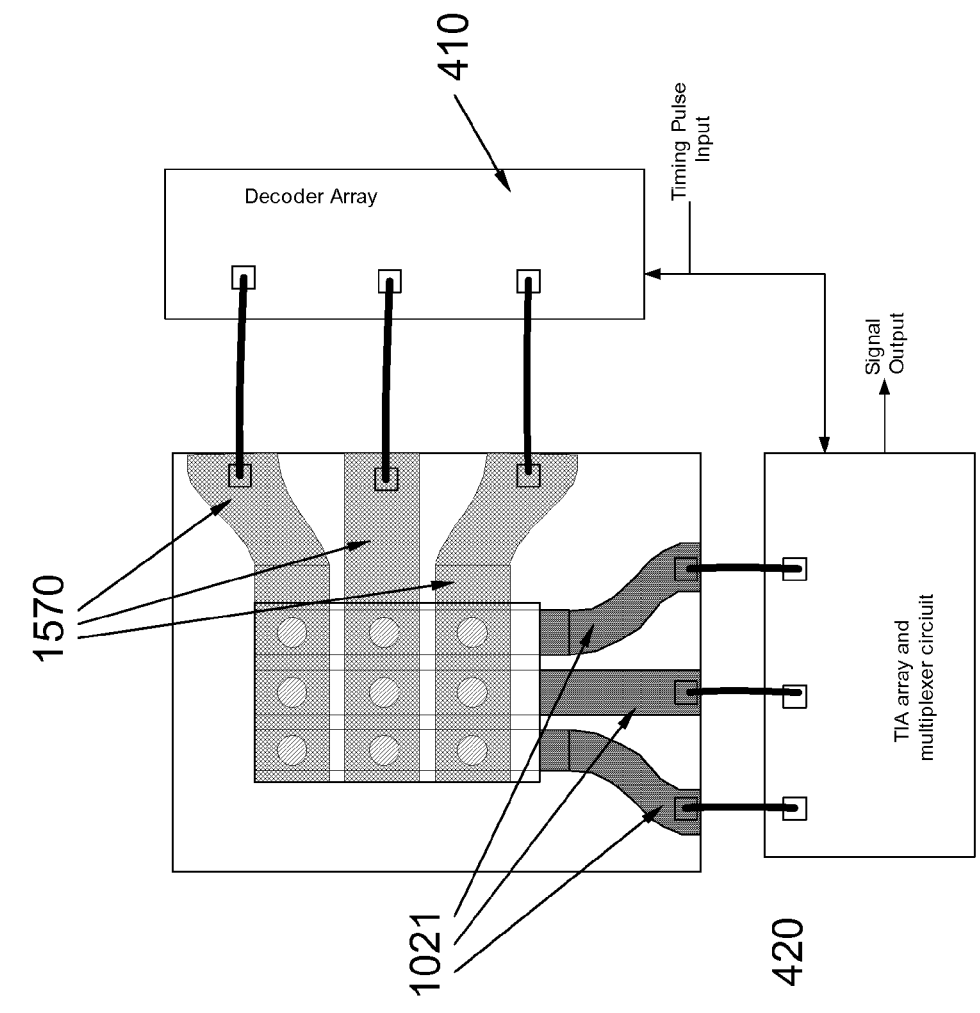

FIGS. 4 and 5 show an apparatus comprising the image sensor and a control circuit. The control circuit comprises a decoder 410 and a trans-impedance amplifier (TIA) and multiplexer circuit 420. The image sensor and the control circuit can be formed as an integrated circuit or chip. To control or address the nanopillars, a gate voltage can be selectively applied to one of the gate lines 1570 at a time to allow electrical current through those nanopillars connected to that particular gate line 1570 and the readout lines 1021 can be used to read electrical current from each of those nanopillars. In this way, a row-by-row (i.e. gate line by gate line) addressing scheme may be executed. The TIA and multiplexer circuit 420 is connected to each readout line 1021 and can include a multiplexer to sequentially output electrical current one each readout line 1021 to a single terminal. The TIA and multiplexer circuit 420 can amplify the electrical current from each readout line 1021 and convert it into a voltage signal. The decoder array 410 is connected to each gate line 1570 and can include a multiplexer to sequentially apply gate voltages to each gate line 1570. The TIA and multiplexer circuit 420 and the decoder array 410 can be synchronized by a common timing signal from a timing pulse input. A controller can be used to generate the timing signal. The control circuit can further comprise other functional components, such as, for example, an analog-to-digital converter, an exposure controller, and a bias voltage circuit, etc. An exemplary TIA can be OPA381; an exemplary multiplexer can be ADG732, and an exemplary decoder can be SN74154 (all from Texas Instruments Inc). It will be appreciated, of course, that other readout circuitry components may also be used.

The control circuit can be connected to the image sensor by any suitable interconnect techniques, such as wire-bonding, flip-chip bonding or bump bonding.

The readout lines 1021 and the gate lines 1570 can be parallel as shown in FIG. 4 or can have a "fan-out" shape as shown in FIG. 5. As will be appreciated the fan out shaped electrodes provide greater room for connections to external circuitry.

The image sensor described herein can be used as various image sensors, including contact image sensors (CIS). Contact image sensors are capable of resolving features of a size approximately equal to the size of the pixel. The size of the pixel may be determined by the size of the nanopillar and the surrounding region in which the evanescent field propagates. CISs are a relatively recent technological innovation in the field of optical flatbed scanners that are rapidly replacing charge-coupled devices (CCDs) in low power and portable applications. As the name implies, CISs place the image sensor in near direct contact with an object to be scanned in contrast to using mirrors to bounce light to a stationary sensor, as is the case in conventional CCD scanners. A CIS typically consists of a linear array of detectors, covered by a focusing lens and flanked by red, green, and blue LEDs for illumination. Usage of LEDs allows the CIS to be relatively power efficient, with many scanners being powered through the minimal line voltage supplied, for instance, via a universal serial bus (USB) connection. CIS devices typically produce lower image quality compared to CCD devices; in particular, the depth of field is limited, which poses a problem for material that is not perfectly flat. However, a CIS contact sensor is typically modularized. All the necessary optical elements may be included in a compact module. Thus, a CIS module can help to simplify the inner structure of a scanner. Further, a CIS contact sensor is typically smaller and lighter than a CCD line sensor. With a CIS, the scanner can be portable with a height around 30 mm.

A CIS can include an elongate optical assembly comprising illumination, optical imaging, and detection systems. The illumination source illuminates a portion of the object (commonly referred to as a "scan region"), whereas the optical imaging system collects light reflected by the illuminated scan region and focuses a small area of the illuminated scan region (commonly referred to as a "scan line") onto the pixels of the CIS. The pixels convert light incident thereon into electrical signals. Image data representative of the entire object then may be obtained by sweeping the CIS across the entire object.

A method of scanning an object using a CIS essentially comprises three steps: first, the pixels of the CIS convert reflected light they receive from the object into analog electrical signals; second, the analog electrical signals are amplified; third, the amplified analog electrical signals are converted to digital electrical signals by an analog-to-digital (A/D) converter. The digital signals may then be further processed and/or stored as desired.

Figure 6:
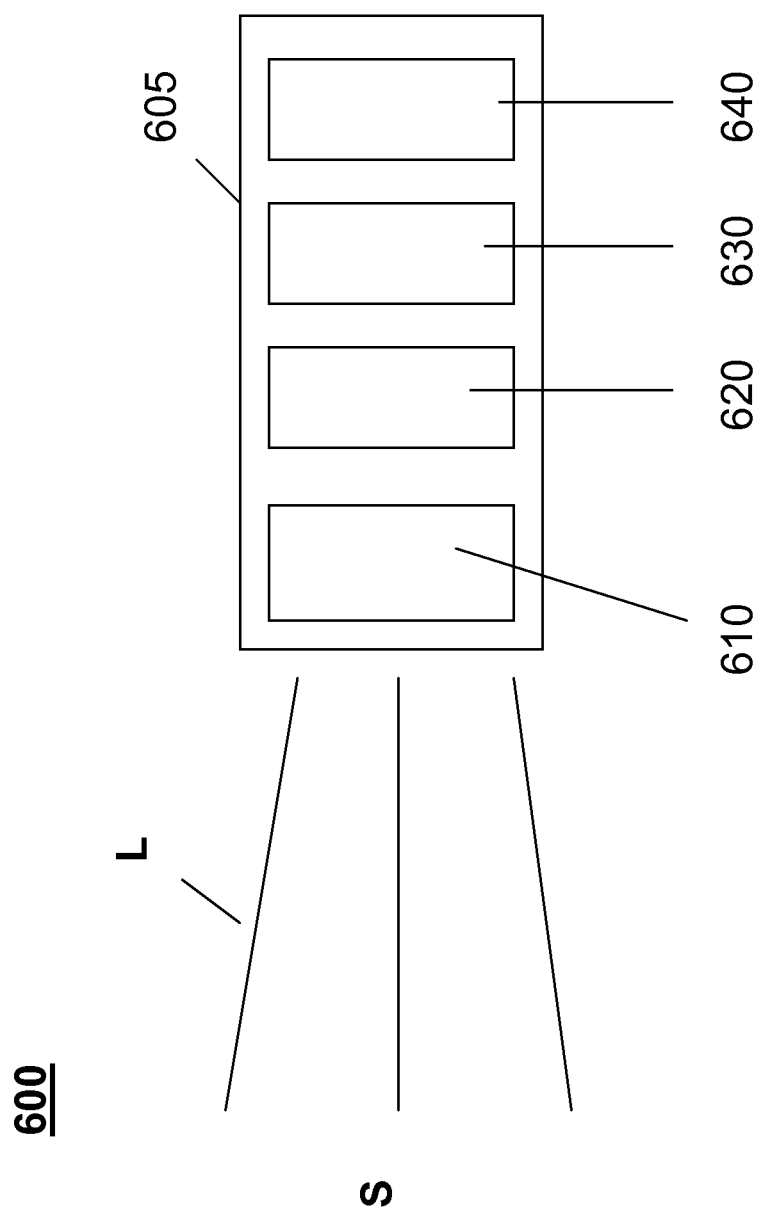
FIG. 6 shows another apparatus comprising the image sensor, according to an embodiment.

FIG. 6 shows a schematic of an apparatus 600 in accordance with an embodiment. The apparatus 600 comprises foreoptics 610, the image sensor 620, a readout circuit (ROC) 630, and a processor 640. A housing may enclose and protect one of more the foregoing components of the apparatus 600 from excessive or ambient light, the environment (e.g., moisture, dust, etc.), mechanical damage (e.g., vibration, shock), etc.

Light (L) from a scene (S) emanates toward the apparatus 600. For clarity, only L from S impinging upon the apparatus 600 is depicted (although it will be appreciated that L from S propagates in all directions).

The foreoptics 610 may be configured to receive L from S and focus or collimate the received L onto the image sensor 620. For instance, foreoptics 610 may include one or more of: a lens, an optical filter, a polarizer, a diffuser, a collimator, etc.

The pixels in the image sensor 620 may include nanopillars of different sizes (e.g. from about 50 to 200 nm) for selective detection of light across a wavelength regions of interest.

The ROC 630 may be connected to the image sensor 620 and is configured to receive output therefrom.

The processor 640 is configured to receive output from the ROC 630. The processor 640 may, in some instances, be configured to provide defect correction, linearity correction, data scaling, zooming/magnification, data compression, color discrimination, filtering, and/or other imaging processing, as desired.

In one embodiment, the processor 640 may include hardware, such as Application Specific Integrated Circuits (ASICs), Field Programmable Gate Arrays (FPGAs), digital signal processors (DSPs), or other integrated formats. However, those skilled in the art will recognize that the processor 640 may, in whole or in part, can be equivalently implemented in integrated circuits, as one or more computer programs having computer-executable instructions or code running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one skilled in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of computer-readable medium used to actually carry out the distribution.

In some implementations, the apparatus 600 may also be configured as a spectrophotometer to measure intensity of reflection or absorption at one more wavelengths.

Depending on the construction of the image sensor 620, light at different wavelengths may be detected nanopillars at different locations and with different sizes. A three- or four-nanopillar pixel may be fabricated. Of course, pixels having additional pillars are also possible.

Figure 7B:
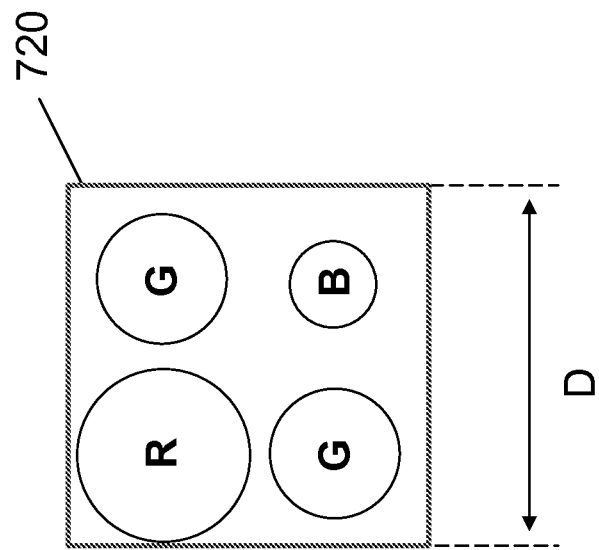
FIGS. 7A and 7B show schematics of a pixel of the image sensor, the pixel having more than one nanopillar sized to absorb and/or detect light of different wavelength or color, according to embodiments.
Figure 7A:
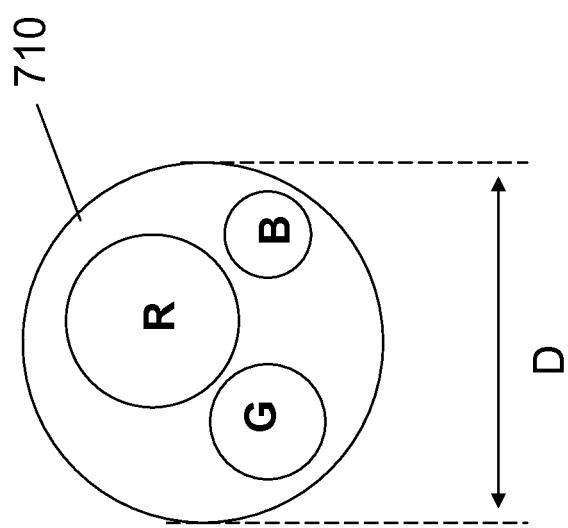

FIGS. 7A and 7B show an exemplary three-nanopillar pixel and an exemplary four-nanopillar pixel according to embodiments. These pixels may be incorporated into the image sensor.

FIG. 7A shows a pixel 710 including three nanopillars R, G, B, having different sizes configured to absorb and/or detect red, green, and blue light, respectively, according to an embodiment. For instance, the R, G, B nanopillars can have sizes effective to absorb and/or detect light of about 650 nm, 510 nm, and 475 nm in wavelength, respectively. The diameter of the pixel 710 may be 10 μm or less. The pixel 710 may be used in traditional shadow masked based display device.

FIG. 7B shows a pixel 720 including four nanopillars R, G, B, G, having different sizes configured to absorb and/or detect red, green, and blue light, respectively, according to an embodiment. Two of the nanopillars, G, absorb and/or detect green light. The diameter of the pixel 720 may be 10 µm or less.

A cladding may, in some instance, surround at least one pixel of the image sensor to increase light absorption. The cladding of pixel 710 and 720 may be formed, for instance, from hafnium oxide or silicon nitride.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The subject matter described herein sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An image sensor comprising:
   a substrate;
   a plurality of pixels each of which has at least one nanopillar essentially extending vertically from the substrate, and a gate electrode surrounding the at least one nanopillar;
   wherein the at least one nanopillar is adapted to convert light impinging thereon to electrical signals and the gate electrode is operable to pinch off or allow current flow through the at least one nanopillar;
   wherein the at least one nanopillar has a cladding, a refractive index of the cladding being smaller than a refractive index of the nanopillar.

2. The image sensor of claim 1, wherein each of the nanopillars has a vertical p-n junction or a vertical p-i-n junction.

3. The image sensor of claim 1, wherein more than one pixels have a common electrode electrically connected thereto.

4. The image sensor of claim 3, wherein the common electrode is a transparent conductive material.

5. The image sensor of claim 1, wherein the nanopillars and the substrate comprise one or more semiconductor materials and/or metals.

6. The image sensor of claim 1, wherein diameters of the nanopillars are from 10 to 2000 nm, 50 to 150 nm, or 90 to 150 nm; and/or lengths of the nanopillars are from 10 to 10000 nm or 100 to 1000 nm; and/or cross-sectional shapes of the nanopillars are circles, squares or hexagons.

7. The image sensor of claim 1, wherein the nanopillars are sized to selectively absorb UV light, red light, green light, blue light, or IR light.

8. The image sensor of claim 1, further comprising a plurality of readout lines, each of which electrically connected to one or more pixels; and a plurality of gate lines, each of which electrically connected to the gate electrode of one or more pixels, wherein no two pixels are connected to a same readout line and their gate electrodes are connected to a same gate line.

9. The image sensor of claim 8, comprising first, second, third and fourth pixels, a first readout line electrically connected to the first and second pixels, a second readout line electrically connected to the third and fourth pixels, a first gate line electrically connected to the gate electrodes of the first and third pixels and a second gate line electrically connected to the gate electrodes of the second and fourth pixels.

10. The image sensor of claim 8, wherein the readout lines and the gate lines have one or more electronic devices connected thereto, the one or more electronic devices are selected from the group consisting of amplifiers, multiplexers, D/A or A/D converters, computers, microprocessing units, and digital signal processors.

11. The image sensor of claim 8, wherein:
   the readout lines comprise a heavily doped semiconductor material;
   each of the nanopillars comprises a body of an intrinsic semiconductor material or lightly doped semiconductor material of the same conduction type as the heavily doped semiconductor material of the readout lines, and a junction layer of the opposite conduction type from the heavily doped semiconductor material of the readout lines;
   the body of each nanopillar is sandwiched between one of the readout lines and the junction layer of the nanopillar;
   the junction layers of all the nanopillars are electrically connected to a transparent conductive layer; and
   the nanopillars are epitaxial with the readout lines.

12. A method of using the image sensor of claim 8, comprises:
   (a) applying a bias voltage to the transparent conductive layer;
   (b) applying a first gate voltage to all the gate lines, the first gate voltage being effective to pinch off electrical current through the nanopillars;
   (c) exposing the image sensor to light;
   (d) connecting all the readout lines to ground to remove accumulated electrical charge thereon, then disconnecting all the readout lines from the ground;
   (e) applying a second gate voltage to one of the gate lines, the second gate voltage being effective to allow electrical current through the nanopillars this one gate line surrounds;

(f) taking a current reading on at least one of the readout lines;

(g) applying the first gate voltage to this one gate line;

(h) optionally repeating steps (d)-(g) on each gate line.

13. An apparatus comprising the image sensor of claim 8, a decoder connected to each gate line, and a trans-impedance amplifier and multiplexer circuit connected to each readout line.

14. The apparatus of claim 13, wherein the trans-impedance amplifier and multiplexer circuit is functional to amplify an electrical current from each readout line and convert it into a voltage signal; the decoder and the trans-impedance amplifier and multiplexer circuit are synchronized by a common timing signal generated by a controller; and/or the decoder and the trans-impedance amplifier and multiplexer circuit are connected to the image sensor by wire-bonding, flip-chip bonding or bump bonding.

15. The image sensor of claim 8, wherein the readout lines are parallel or have a fan-out shape, and/or the gate lines are parallel or have a fan-out shape.

16. A method of using the image sensor of claim 1, comprises:
   exposing the pixels to light;
   reading an electrical signal from a pixel by connecting at least one nanopillar in the pixel, using the gate electrode surrounding the at least one nanopillar, to external readout circuitry.

17. The method of claim 16, wherein the electrical signal is an electric charge accumulated on the at least one nanopillar, a change of electrical current through the at least one nanopillar, or a change of electrical impedance of the at least one nanopillar.

18. A method of using the image sensor of claim 1 to scan an object, comprises:
   converting reflected light from the object received by the pixels into analog electrical signals;
   amplifying the analog electrical signals;
   converting the amplified analog electrical signals to digital electrical signals using an analog-to-digital converter.

19. An apparatus comprising the image sensor of claim 1, further comprises foreoptics, and a readout circuit, wherein the foreoptics are configured to receive light from a scene and focus or collimate the light onto the image sensor; and the readout circuit is connected to the image sensor and configured to receive output from the image sensor.

20. The apparatus of claim 19, wherein the foreoptics comprise one or more of a lens, an optical filter, a polarizer, a diffuser, a collimator; and/or the readout circuit comprises one or more of ASICs, FPGAs, DSPs.

21. The image sensor of claim 1, comprising at least one pixel comprising at least first, second, and third nanopillars having a size effective to absorb and/or detect light of about 650 nm, 510 nm and 475 nm in wavelength, respectively.

22. The image sensor of claim 1, comprising at least one pixel comprising at least first, second, third and fourth nanopillars having a size effective to absorb and/or detect light of red, green, green and blue light, respectively.

23. The image sensor of claim 1, further comprising a cladding surrounding at least one of the pixels or at least one of the nanopillars.

24. The image sensor of claim 23, wherein the cladding is hafnium oxide or silicon nitride.

25. The image sensor of claim 1, further comprising a micro lens on an upper end of the at least one nanopillar.

26. The image sensor of claim 1, wherein the at least one nanopillar has an absorptance of at least 50% across an entire wavelength range from 400 nm to 800 nm.

27. A method of manufacturing an image sensor comprising:
   providing a substrate having an oxide layer, a heavily doped layer on the oxide layer, and an epi layer on the heavily doped layer, the epi layer being intrinsic or lightly doped to a same conduction type as the heavily doped layer;
   forming a junction layer on the epi layer, the junction layer being of an opposite conduction type as the heavily doped layer;
   forming nanopillars from the junction layer and a portion of the epi layer, the nanopillars essentially extending vertically from the substrate;
   forming readout lines from the heavily doped layer; and
   forming gate lines.

28. The method of claim 27, wherein:
   the heavily doped layer is p type or n type;
   the heavily doped layer is about 500 nm thick;
   the epi layer is about 3000 to 10000 nm thick;
   the junction layer is about 10 to 200 nm thick;
   the nanopillars are formed by deep etching;
   the readout lines are formed by deep etching; and/or
   the gate lines are formed by depositing a metal layer.

29. A method of manufacturing an image sensor comprising:
   providing a substrate having an oxide layer, and a heavily doped layer on the oxide layer;
   growing nanopillars essentially extending vertically from the substrate;
   forming a junction layer on a top surface of each nanopillar, the junction layer being of an opposite conduction type as the heavily doped layer;
   forming readout lines from the heavily doped layer; and
   forming gate lines.

30. The method of claim 29, wherein:
   the heavily doped layer is p type or n type;
   the heavily doped layer is about 500 nm thick; and
   the nanopillars are epitaxial with the heavily doped layer;
   the nanopillars are grown by a VLS method;
   the junction layer is formed by ion implantation;
   the readout lines are formed by deep etching; and/or
   the gate lines are formed by depositing a metal layer.

* * * * *